United States Patent
Ohno et al.

(10) Patent No.: US 10,725,906 B2
(45) Date of Patent: *Jul. 28, 2020

(54) STORAGE DEVICE THAT RESTORES DATA LOST DURING A SUBSEQUENT DATA WRITE

(71) Applicant: Toshiba Memory Corporation, Tokyo (JP)

(72) Inventors: Katsuya Ohno, Yokohama Kanagawa (JP); Konosuke Watanabe, Kawasaki Kanagawa (JP); Kenta Yasufuku, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/279,787

(22) Filed: Feb. 19, 2019

(65) Prior Publication Data

US 2019/0179746 A1 Jun. 13, 2019

Related U.S. Application Data

(63) Continuation of application No. 15/714,776, filed on Sep. 25, 2017, now Pat. No. 10,248,560.

(30) Foreign Application Priority Data

Sep. 26, 2016 (JP) ................................ 2016-187377
Jul. 7, 2017 (JP) ................................ 2017-134133

(51) Int. Cl.
*G11C 16/06* (2006.01)
*G06F 12/02* (2006.01)
(Continued)

(52) U.S. Cl.
CPC .......... *G06F 12/0246* (2013.01); *G06F 3/064* (2013.01); *G06F 3/0619* (2013.01);
(Continued)

(58) Field of Classification Search
CPC .................................................. G06F 11/1048
(Continued)

(56) References Cited

U.S. PATENT DOCUMENTS 5,734,814 A 3/1998 Corbin et al.
7,757,038 B2 7/2010 Kitahara
(Continued)

FOREIGN PATENT DOCUMENTS

JP 2006018373 A 1/2006
JP 2010152551 A 7/2010
JP 2013016149 A 1/2013

*Primary Examiner* — Hoai V Ho
(74) *Attorney, Agent, or Firm* — Kim & Stewart LLP

(57) ABSTRACT

A storage device that can be connected to a host device includes a plurality of nonvolatile memories. Each nonvolatile memory includes first memory cells connected to a first word line and second memory cells connected to a second word line. The second word line is adjacent to the first word line. A method of operating the storage device includes maintaining parity data for the data that has been written to the first memory cells, and, upon detecting a failure in the writing of data to the second memory cells, restoring the data written to the first memory cells using the parity data.

15 Claims, 23 Drawing Sheets

(51) Int. Cl.
*G11C 16/10* (2006.01)
*H03M 13/29* (2006.01)
*H03M 13/27* (2006.01)
*G06F 11/10* (2006.01)
*G06F 3/06* (2006.01)
G11C 16/04 (2006.01)

(52) U.S. Cl.
CPC .......... *G06F 3/0656* (2013.01); *G06F 3/0688* (2013.01); *G06F 11/108* (2013.01); *G06F 11/1044* (2013.01); *G06F 11/1072* (2013.01); *G11C 16/10* (2013.01); *H03M 13/27* (2013.01); *H03M 13/2942* (2013.01); *G11C 16/0483* (2013.01)

(58) Field of Classification Search
USPC .................................................. 365/185.09
See application file for complete search history.

(56) References Cited

U.S. PATENT DOCUMENTS

| | | |
|---|---|---|
| 8,656,252 B2 | 2/2014 | So et al. |
| 9,093,132 B2 | 7/2015 | Kim et al. |
| 9,257,195 B2 | 2/2016 | Oh et al. |
| 10,102,071 B2 | 10/2018 | Ohno et al. |
| 10,248,560 B2 * | 4/2019 | Ohno .................. G06F 12/0246 |
| 2010/0161883 A1 | 6/2010 | Kurashige |
| 2015/0355844 A1 | 12/2015 | Dover et al. |
| 2018/0089021 A1 | 3/2018 | Ohno et al. |

* cited by examiner

Address mapping

FIG. 10

STORAGE DEVICE THAT RESTORES DATA LOST DURING A SUBSEQUENT DATA WRITE

CROSS-REFERENCE TO RELATED APPLICATION

This application is a continuation of U.S. patent application Ser. No. 15/714,776, filed on Sep. 25, 2017, which is based upon and claims the benefit of priority from Japanese Patent Application No. 2016-187377, filed Sep. 26, 2016, and Japanese Patent Application No. 2017-134133, filed Jul. 7, 2017, the entire contents of each of which are incorporated herein by reference.

FIELD

Embodiments described herein relate generally to a storage device such as a semiconductor storage device.

BACKGROUND

As a device pitch of wirings formed in a nonvolatile semiconductor memory of a storage device decreases, it becomes more difficult to maintain reliability of the storage device.

DESCRIPTION OF THE DRAWINGS

FIG. 10 illustrates control of data writing by the memory controller according to the first embodiment.

DETAILED DESCRIPTION

Figure 1:
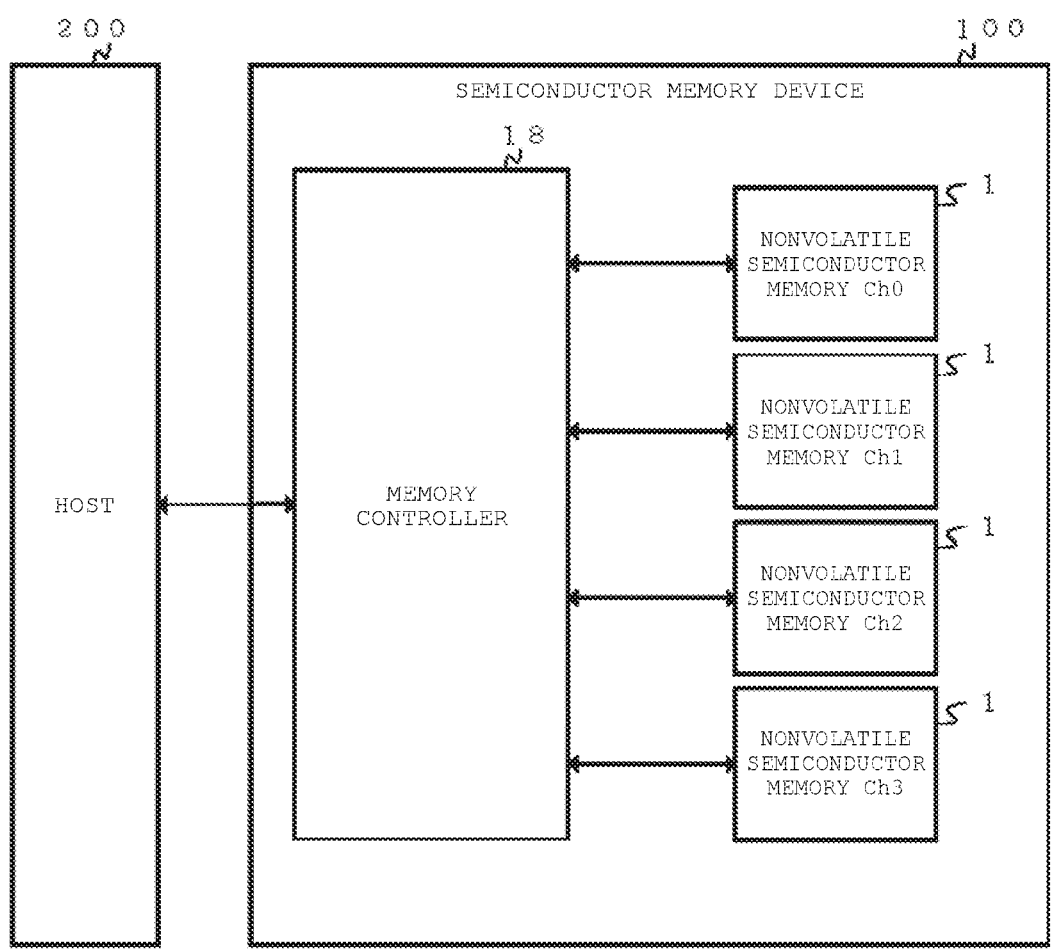
FIG. 1 is a block diagram of a semiconductor memory device according to a first embodiment.

An example embodiment is directed to improving reliability of a storage device.

In general, according to an embodiment, a storage device that can be connected to a host device includes a plurality of nonvolatile memories. Each nonvolatile memory includes first memory cells connected to a first word line and second memory cells connected to a second word line. The second word line is adjacent to the first word line. A controller in the storage device is configured to maintain parity data for the data that has been written to the first memory cells, and, upon detecting a failure in the writing of data to the second memory cells, restore the data written to the first memory cells using the parity data.

A semiconductor memory device according to example embodiments will be described with reference to the drawings. In the following description, elements having the same function or configuration are described with the same reference numeral.

First Embodiment

FIG. 1 is a block diagram of a semiconductor memory device according a first embodiment.

A semiconductor memory device 100 illustrated in FIG. 1 includes a plurality of nonvolatile semiconductor memories 1 and a memory controller 18. The nonvolatile semiconductor memory 1 stores data in a nonvolatile manner. The memory controller 18 communicates with a host 200 and controls operation of the entire semiconductor memory device 100. A description of a functional block necessary for reading data from the nonvolatile semiconductor memory 1 will be omitted below.

According to the present embodiment, the host 200 is described as a computer that supports an interface conforming to NVM Express® (NVMe). However, the host 200 may be a computer that supports an interface conforming to other specifications, for example, Serial ATA (SATA) specifications or Serial Attached SCSI (SAS).

The memory controller 18, for example, is a semiconductor integrated circuit that is configured as a system on a chip (SoC).

The nonvolatile semiconductor memory 1 according to the present embodiment is a flash memory that has a structure including a plurality of memory cells that are stacked on top of one another on a semiconductor substrate, but may be a different type of memory, for example, a NAND flash memory, a NOR flash memory, a magneto resistive random access memory (MRAM), or the like.

The semiconductor memory device 100 according to the present embodiment has nonvolatile semiconductor memories 1 of four channels (Ch's). The nonvolatile semiconductor memories 1 are hereinafter expressed as nonvolatile semiconductor memories Ch0 to Ch3. The number of channels may be greater than or smaller than 4. The memory controller 18 can write data in parallel to each channel of the nonvolatile semiconductor memories 1, and read data in parallel from each channel.

Next, a configuration of the nonvolatile semiconductor memory 1 according to the first embodiment is described with reference to FIGS. 2 to 7.

Figure 2:
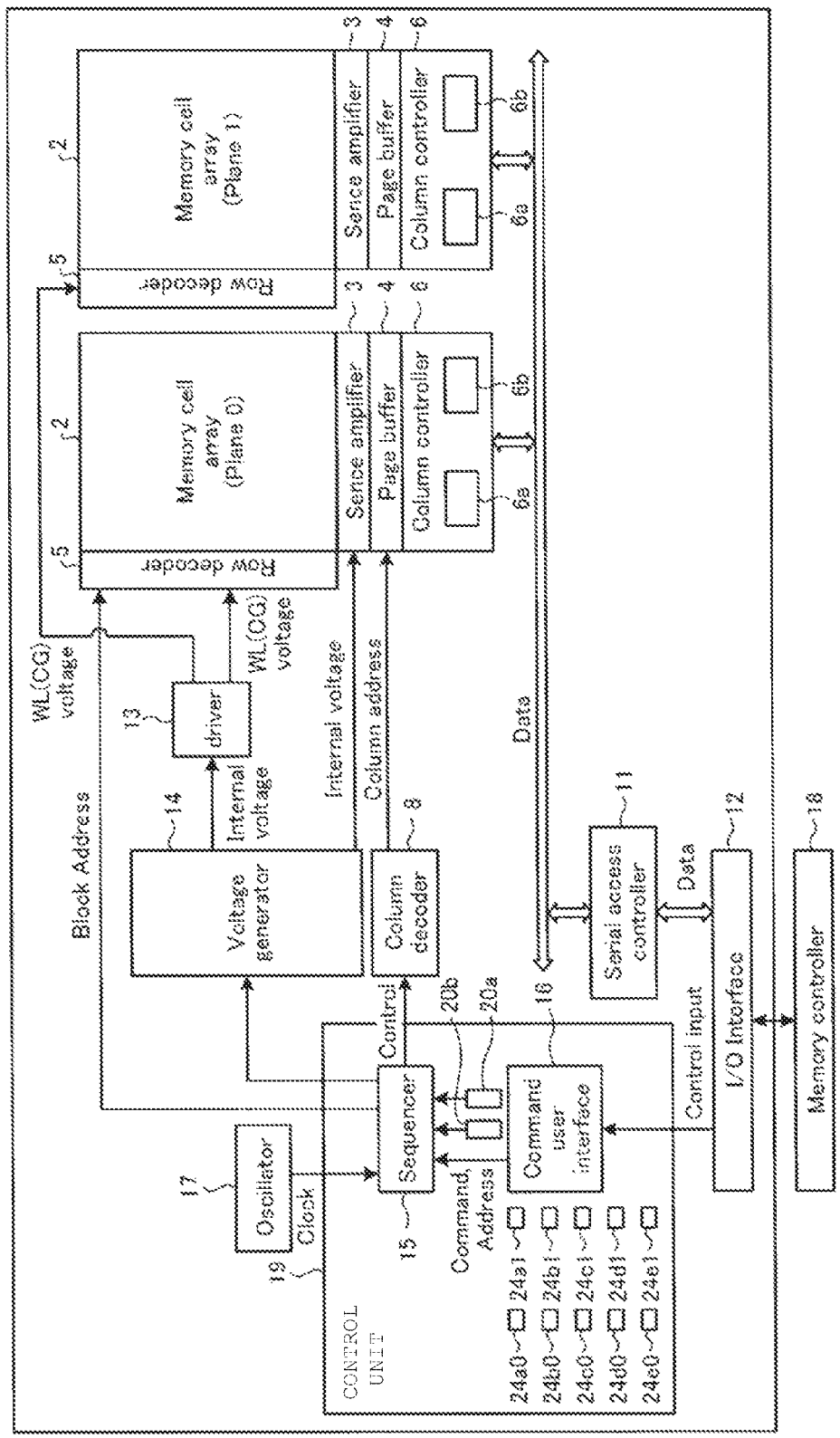
FIG. 2 is a block diagram of a nonvolatile semiconductor memory included in the semiconductor memory device according to the first embodiment.

FIG. 2 is a block diagram of the nonvolatile semiconductor memory 1 according to the first embodiment. As illustrated in FIG. 2, the nonvolatile semiconductor memory 1 includes elements, such as a memory cell array 2, a sense amplifier unit 3, a page buffer 4, a row decoder 5, a column control circuit 6, a data bus 7, a column decoder 8, a serial access controller 11, an I/O interface 12, a driver 13, a voltage generation circuit 14, a sequencer 15, a command user interface 16, an oscillator 17, a control unit 19, registers 20a and 20b, and registers 24a0 to 24e0 and 24a1 to 24e1. The nonvolatile semiconductor memory 1, for example, is equivalent to one semiconductor chip.

The nonvolatile semiconductor memory 1 is controlled by the memory controller 18. The memory controller 18 is electrically connected to the I/O interface 12. The nonvolatile semiconductor memory 1 and the memory controller 18 transmit and receive data through the I/O interface 12.

Furthermore, the sequencer 15, the command user interface 16, and the registers 20a and 20b configure the control unit 19.

Each functional block can be either a piece of hardware or a piece of software, or as a combination of both. For this reason, from the perspective of these functions, a description will be generally made so that each block is apparently any of hardware and software. Furthermore, it is not indispensable to distinguish one function block from another as illustrated in a specific example in FIG. 2. For example, some functions may be performed by another functional block. Particularly, a function that is described as an example may be performed by any one of the nonvolatile semiconductor memory 1 and the memory controller 18. Additionally, a functional block that is described as an example may be further divided into a plurality of functional sub-blocks. The present embodiment is not limited by which functional block performs a function.

Next, a structure of the entire memory cell array 2 according to the present embodiment is described.

The nonvolatile semiconductor memory 1 includes a plurality of memory cell arrays 2. Two memory cell arrays 2 are illustrated in FIG. 2, but the nonvolatile semiconductor memory 1 may include three or more memory cell arrays 2. In some cases, the memory cell array 2 is referred to as a plane. Two planes are referred to as Plane 0 and Plane 1, respectively. Each memory cell array 2 includes a plurality of memory blocks (which are hereinafter simply referred to as a block). Each block has a plurality of string units. Each string unit has a plurality of strings. The details will be described with reference to FIG. 3 and other figures.

Each string includes a plurality of cell transistors that are connected to one another in series, two selection gate transistors that are formed on both ends the string, respectively, and back gate transistors. A plurality of strings is connected to one bit line. A plurality of cell transistors located at a specific position of a plurality of strings, respectively, share a word line. Cell transistors that are included in a common string unit and share the word line, or a storage space of the cell transistors configures a page. Data are read and written in units of a page. On the other hand, data are erased in units of a block. The memory cell array 2 has a three-dimensional structure. According to the present embodiment, a unit of data erasure is a block, but there is no limitation to the unit of data erasure. For example, a scheme of erasing data for every string unit or for every half a string unit may be employed.

Figure 3:
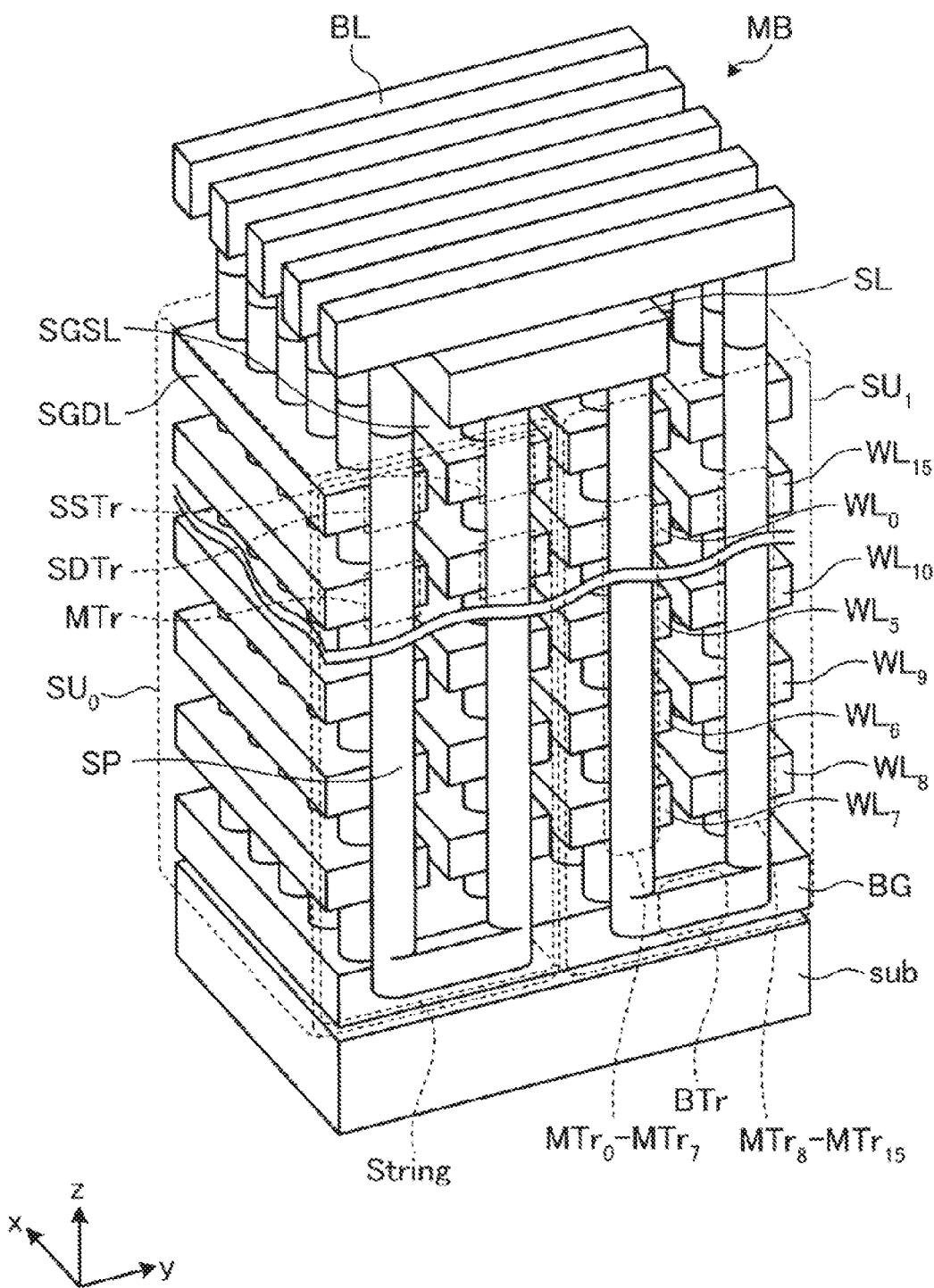
FIG. 3 is a perspective view of a portion of a memory cell array in the nonvolatile semiconductor memory according to the first embodiment.
Figure 4:
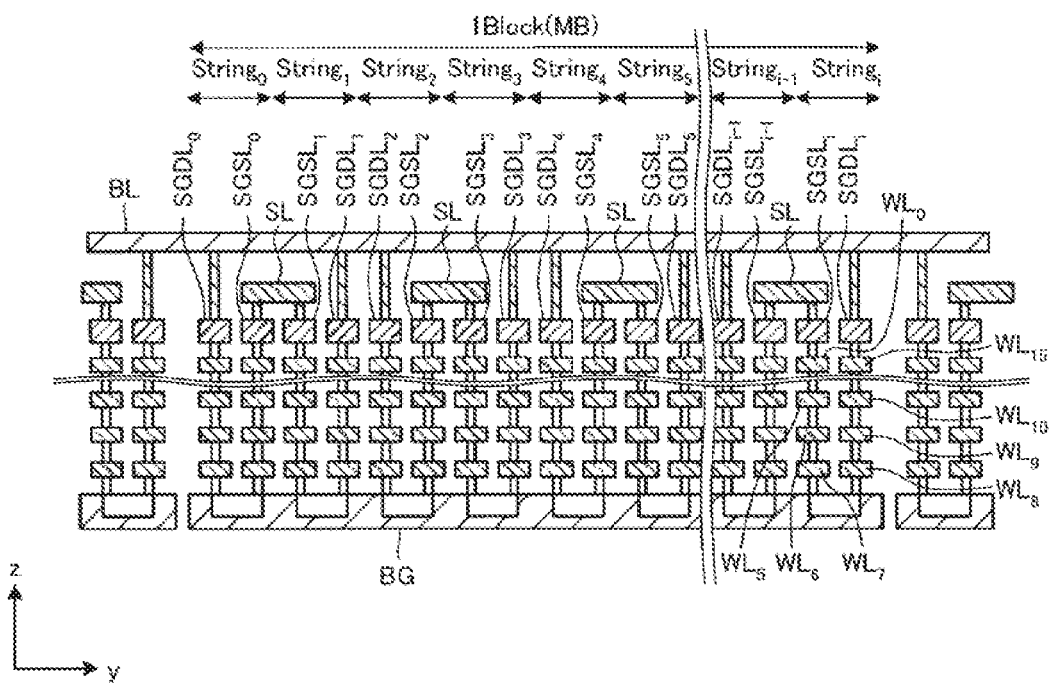
FIG. 4 is a cross-sectional view of a portion of the memory cell array according to the first embodiment.

A detailed configuration of the memory cell array 2 is described with reference to FIGS. 3 and 4. FIG. 3 is a perspective view of the memory cell array 2 according to the first embodiment. FIG. 4 is a cross-sectional diagram of a portion of the memory cell array 2 according to the first embodiment. FIG. 3 is a perspective view of a memory group that has two string units. FIG. 4 is a cross-sectional view of the portion of the memory cell array 2 along a y-z plane.

As illustrated in FIGS. 3 and 4, a back gate BG that is made of a conductive material is formed in on a substrate sub. The back gate BG extends along an x-y plane. Furthermore, a plurality of string units SU is formed in an upward direction on the substrate "sub". A plurality of strings "String" are formed in the string unit SU. Specifically, the string unit SU includes the plurality of strings "String" that are lined up in rows in a direction (x direction in FIG. 3) that perpendicularly intersects the bit line BL. One block includes i string units, where i is a natural number. A string unit SU that includes a string "String$_0$" is referred to as a string unit SU$_0$. In the same manner, a string unit that includes a string "String$_Y$" is referred to as a string unit SU$_Y$ (Y=1 to i−1). For the convenience of illustration, in FIG. 3, only the string unit SU$_0$ and a string unit SU$_1$ are illustrated. If there is no need to distinguish each of the reference characters (for example, strings "String$_0$" to "String$_{i-1}$"), each of which is suffixed with a number, from the others, expressions are used with the suffix numbers being omitted, and such expressions are all assumed to refer to their respective reference characters suffixed with numbers.

In FIG. 3, one string "String" includes n memory cell transistors MTr, where n is a natural number. FIGS. 3 and 4 illustrate an example in which one string includes 16 cell transistors MTr$_0$ to MTr$_{15}$. The cell transistors MTr$_7$ and MTr$_8$ are connected to each other through a back gate transistor BTr. First ends of a source side selection gate transistor SSTr and a drain side selection gate transistor SDTr are connected to cell transistors MTr$_0$ and MTr$_{15}$, respectively. A source line SL and the bit line BL extend over the transistors SSTr and SDTr, respectively. Second ends of the transistors SSTr and SDTr are connected to the source line SL and the bit line BL, respectively.

Figure 5:
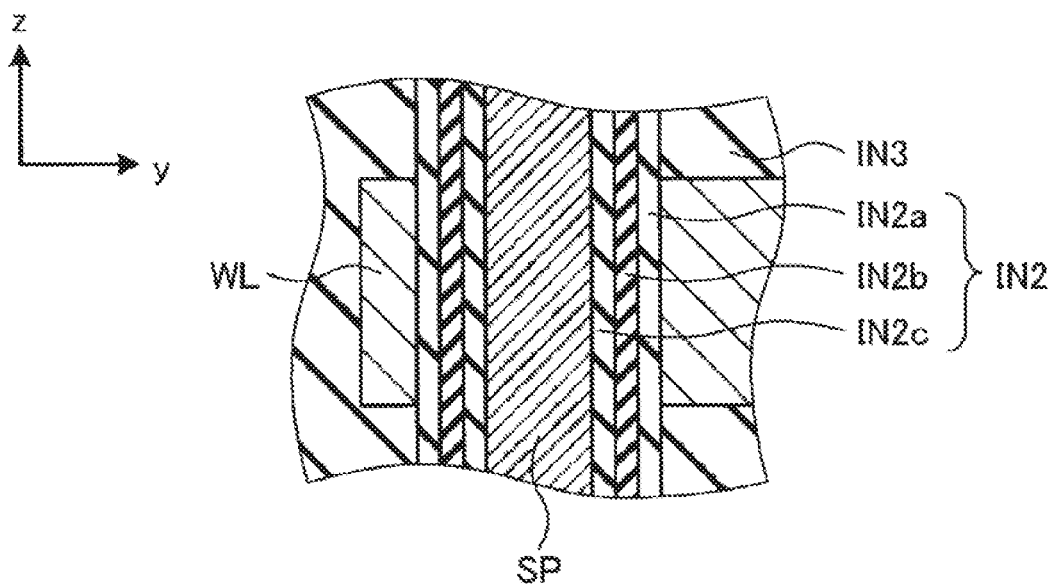
FIG. 5 is a cross-sectional view of a memory cell transistor according to the first embodiment.

The cell transistors MTr$_0$ to MTr$_{15}$ include a semiconductor pillar SP and an insulating film IN2 (which is illustrated in FIG. 5) on a surface of the semiconductor pillar SP. The semiconductor pillar SP is made of silicon and extends in an upward direction, from the back gate BG. Two semiconductor pillar SP that configure one string "String" are connected to each other by a pipe layer that is made of a conductive material in the back gate BG. The pipe layer configures the back gate transistor BTr. The insulating film IN2, as illustrated in FIG. 5, includes a block insulating film IN2a on the semiconductor pillar SP, a charge trapping layer IN2b on the insulating film IN2a, and a tunnel insulating film IN2c on the charge trapping layer IN2b. The charge trapping layer IN2b is made of an insulating material.

As illustrated in FIGS. 3 and 4, the cell transistors $MTr_0$ to $MTr_{15}$ are connected to word lines (control gates) $WL_0$ to $WL_{15}$ that extend over x axis. The word lines $WL_0$ to $WL_{15}$ are selectively connected to the corresponding CG line CG (CG lines $CG_0$ to $CG_{15}$) via the row decoder 5. The CG line CG is not illustrated in FIGS. 3 and 4. The cell transistor MTr stores data that correspond to the number of carriers in the charge trapping layer IN2b, in a nonvolatile manner.

A gate electrode (a gate) of each cell transistor $MTr_0$ in a plurality of strings "$String_0$" that are lined in rows along x axis, in each block MB, is connected commonly to the word line $WL_0$. In the same manner, each gate of each cell transistor $MTr_X$ in a plurality of strings "String" that are lined in rows along x axis, in each block MB, is connected commonly to a word line $WL_X$. X is 0 or a natural number equal to or smaller than n. Additionally, this is also true for other strings "String". Furthermore, each gate of each cell transistor $MTr_X$ in a plurality of strings "String" that are lined in rows along y axis, in each block MB, is connected commonly to the word line $WL_X$. That is, the word line $WL_0$ is shared by all strings "String" in one block MB. In the same manner, the word lines $WL_1$ to $WL_7$ are also shared.

Figure 7:
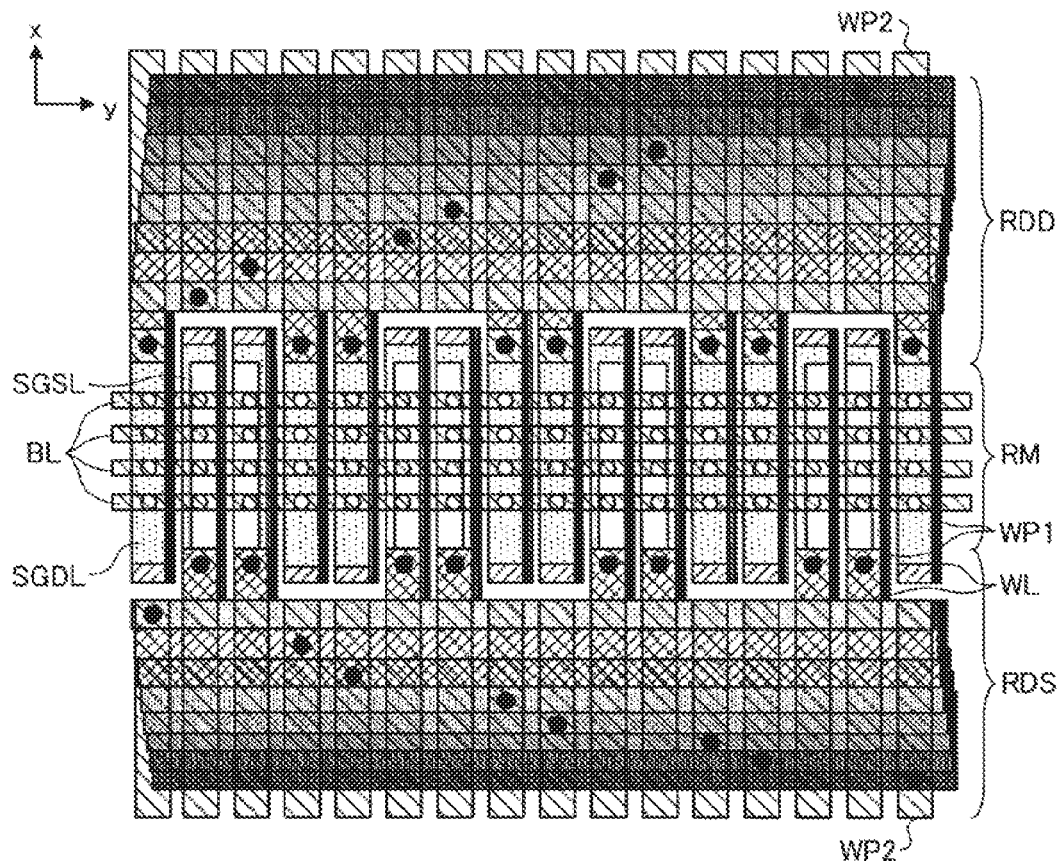
FIG. 7 is a top-view of a portion of the memory cell array according to the first embodiment.

A plurality of strings "String" that are lined up in rows along y axis, in each block MB, is connected commonly to the bit line BL. All cell transistors $MTr_0$ within the block MB is connected commonly to the word line $WL_0$. In the same manner, all cell transistors $MTr_Z$ within the block MB is connected commonly to the word line $WL_Z$. Z is 0 or a natural number equal to or smaller than i. Therefore, each word line WL, as illustrated in FIG. 7, is formed in the comb-like shape.

The word line WL has a first portion WP1 in a cell region RM and a second portion WP2 in extending regions RDD and RDS. The extending region RDD and the extending region RDS are arranged to face each other. Furthermore, the cell area RM is positioned between the extending region RDD and the extending region RDS.

In each word line WL, a plurality of first portions extends in x direction from the second portion and thus the comb-like shape is formed.

Furthermore, the block MB has a feature in which the same bias is applied to all strings at the time of data erasure, and so the block MB is a unit of data erasure. A gate of each back gate transistor BTr is connected commonly to a back gate line BG.

A page is configured by the memory cell transistors MTr that are included in a common string unit SU or the storage space thereof, among a plurality of cell transistors MTr that share a word line. One page, for example, has a size of 8 k bytes. For example, if 2-bit data are retained in each cell transistor MTr, data stored in the memory cell transistors MTr included in the common string unit SU, among a plurality of cell transistors MTr that are commonly connected to the word line WL, amount to two pages.

The selection gate transistors SSTr and SDTr each include the semiconductor pillar SP and a gate insulating film (not illustrated) on the surface of the semiconductor pillar SP, and include gates (selection gate lines) SGSL and SGDL, respectively.

A gate of each source side selection gate transistor SSTr in the plurality of strings "$String_0$" that are lined up in rows along x axis, in each block MB, is connected commonly to a source side selection gate line $SGSL_0$. In the same manner, each gate of each transistor SSTr in a plurality of strings "$String_Y$" that are lined in rows along x axis, in each block MB, is connected commonly to a selection gate line $SGSL_Y$. The selection gate line SGSL extends along x axis. The selection gate line SGSL is selectively connected to an SGS line SGS (not illustrated) by the row decoder 5. A first end of each transistor SSTr in two adjacent strings "String" is connected to the same source line SL. The source lines SL in one block are connected to each other.

A gate of each drain side selection gate transistor SDTr in the plurality of strings "$String_0$" that are lined up in rows along x axis, in each block MB, is connected commonly to a selection gate line $SGDL_0$. In the same manner, each gate of each transistor SDTr in a plurality of strings "$String_Y$" that are lined in rows along x axis, in each block MB, is connected commonly to a selection gate line $SGDL_Y$. The selection gate lines SGDL extends along x axis. A first end of each drain-side selection gate transistor SDTr in all strings "String" in one block, which are lined up in rows along y axis, is connected to the same bit line BL.

As described above, a plurality of strings "$String_Y$" (that is connected to a different bit line BL) that are lined up in rows along x axis, in each block MB, share the selection gate lines SGSL and SGDL and the word lines $WL_0$ to $WL_{15}$.

Next, an entire structure of a sense amplifier unit 3, the page buffer 4, the row decoder 5, and the column control circuit 6 according to the present embodiment is described.

A set of the sense amplifier unit 3, the page buffer 4, the row decoder 5, and the column control circuit 6 is provided for every plane (every memory cell array 2). For the convenience of illustration, according to the present embodiment that exemplifies a configuration of two Planes, two row decoders 5 are expressed as row decoder 5-1 and 5-2 in FIG. 6. Each sense amplifier unit 3 includes a plurality of bit lines and a plurality of sense amplifier units that are connected individually to the plurality of bit lines, and senses and amplifies a potential of the corresponding bit line.

Based on a column address, each page buffer 4 receives data from out of the nonvolatile semiconductor memory 1 at the time of data writing, through the data bus 7, and temporarily retains the received data. The column address is supplied by the column decoder 8.

The data bus 7 is connected to the serial access controller 11. The serial access controller 11 is connected to the I/O interface 12. The I/O interface 12 includes a plurality of signal terminals, and serves as an interface between the nonvolatile semiconductor memory 1 and the memory controller 18. The serial access controller 11 performs control including conversion of a parallel signal on the data bus 7 and a serial signal through the I/O interface 12.

Each row decoder 5 receives a block address signal, and based on the received signal, selects a specific block. Specifically, each row decoder 5 connects the string unit SU in a selected block to string drivers $13STR_0$ and $13STR_1$ and CG drivers $13C_0$ to $13C_{15}$ of a driver 13. The driver 13 receives a voltage from the voltage generation circuit 14, and generates a voltage necessary for various operations (reading, writing, erasing, and the like) carried out in the nonvolatile semiconductor memory 1. A voltage that is output from the driver 13 is applied to a word line and a gate electrode of the selection gate transistor. The voltage generation circuit 14 applies a voltage necessary for operation by the sense amplifier unit 3 also to the sense amplifier unit 3.

The sequencer 15 of the control unit 19 receives a signal, such as a command or an address, from the command user interface 16, and operates based on a clock from the oscillator 17. Based on the received signal, the sequencer 15 controls various elements (functional blocks) in the nonvolatile semiconductor memory 1. For example, based on the signals, such as the received command and the received address, the sequencer 15 controls the column decoder 8 and the voltage generation circuit 14. Furthermore, based on the signals, such as the received command and the received address, the sequencer 15 outputs a block address and a string unit address. The block address varies from one plane to another, and includes information for selecting a block that varies from one plane to another or the same block. The string unit address varies from one plane to another, and includes information for selecting a string that varies from one plane to another or the same string. The command user interface 16 receives a control signal through the I/O interface 12. The command user interface 16 decodes the received control signal, and acquires the command, the address, and the like.

The nonvolatile semiconductor memory 1 may be configured so as to store data of two or more bits in one memory cell.

Figure 6:
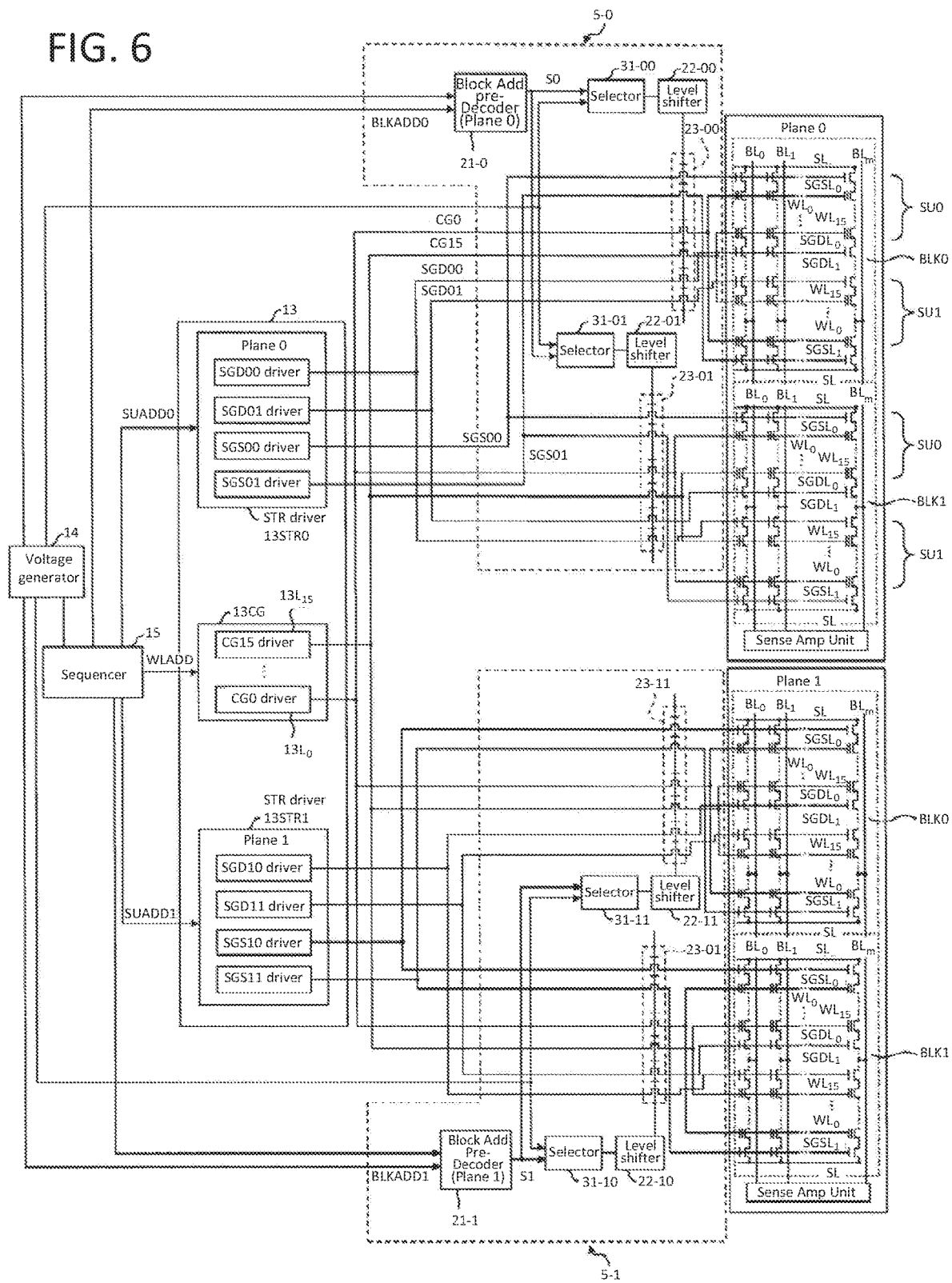
FIG. 6 is a block diagram of a portion of the nonvolatile semiconductor memory according to the first embodiment.

Next, a detailed configuration of the row decoder 5, the driver 13, and the sequencer 15 is described with reference to FIG. 6. FIG. 6 are block diagrams of a portion of the nonvolatile semiconductor memory 1 according to the first embodiment. FIG. 6 illustrates an element relating to the decoder in FIG. 2 and an element that is associated with the decoder.

For the convenience of illustration, the nonvolatile semiconductor memory 1 in FIG. 6 is illustrated as having Plane 0 and Plane 1. Furthermore, each of Planes 0 and 1 is assumed to have two blocks, that is, BLK0 and BLK1, and each block BLK is assumed to have two string units SU. The number of planes, the number of blocks BLK, and the number of string units SU are not limited to two, and may be the different number of planes, the different number of blocks, and the different number of string units, respectively.

The row decoder 5 according to the present embodiment, as illustrated in FIG. 6, has a row decoder 5-0 for Plane 0, a row decoder 5-1 for Plane 1, and selection units 31-00, 31-01, 31-10, and 31-11. The selection units 31-00 and 31-01 are for Plane 0, and the selection units 31-10 and 31-11 are for Plane 1. The row decoders 5-0 and 5-1 have the same configuration (element and connection). Furthermore, the selection units 31-00, 31-01, 31-10, and 31-11 have the same configuration. An element relating to Plane 0 will be described below. However, the following description applies also to Plane 1. The nonvolatile semiconductor memory in FIG. 6, as described with reference to FIG. 2, is equivalent to, for example, one semiconductor chip.

The driver 13 includes the string drivers $13STR_0$ and $13STR_1$, and the CG drivers $13C_0$ to $13C_{15}$. The string driver $13STR_0$ has a function of selecting a string for Plane 0. The string driver $13STR_1$ has a function of selecting a string for Plane 1.

The string driver $13STR_0$ has two SGD drivers $13SGD_{00}$ to $13SGD_{01}$ and two SGS drivers $13SGS_{00}$ to $13SGS_{01}$. Furthermore, the string driver $13STR_1$ has two SGD drivers $13SGD_{10}$ to $13SGD_{11}$ and two SGS drivers $13SGS_{10}$ to $13SGS_{11}$.

The two SGD drivers $13SGD_{00}$ to $13SGD_{01}$, the two SGD drivers $13SGD_{10}$ to $13SGD_{11}$, the two SGS drivers $13SGS_{00}$ to $13SGS_{01}$, the two SGS drivers $13SGS_{10}$ to $13SGS_{11}$, and CG line drivers $13C_0$ to $13C_{15}$ drive SG lines $SGD_{00}$ to $SGD_{01}$ that are connected to each block BLK in Plane 0, SG lines $SGD_{10}$ to $SGD_{11}$ that are connected to each block BLK in Plane 1, SG lines $SGS_{00}$ to $SGS_{01}$ that are connected to each block BLK in Plane 0, SG lines $SGS_{10}$ to $SGS_{11}$ that are connected to each block BLK in Plane 1, and CG lines $CG_0$ to $CG_{15}$, respectively, under the control of the sequencer 15. The driver 13 is common to Plane 0 and Plane 1. The driver 13 receives an address (which is referred to as a string unit address signal SUADD) indicating a string unit SU, from the sequencer 15. Specifically, the driver 13 receives a string unit address signal SUADD0 in Plane 0 and a string unit address signal SUADD1 in Plane 1, and controls the four SGD drivers $13SGD_{00}$ to $13SGD_{11}$ and the four SGS drivers $13SGS_{00}$ to $13SGS_{11}$.

The row decoder 5-0 includes a block address predecoder 21-0, two level shifters 22-00 to 22-01, and two transfer transistor groups 23-00 to 23-01.

The block address predecoder 21-0 is connected to the selection units 31-00 and 31-01. The selection units 31-00 and 31-01 are connected to the level shifters 22-00 and 22-01. The level shifter 22-00 is connected to a gate of each transfer transistor in the transfer transistor group 23-00. The level shifter 22-01 is connected to a gate of each transfer transistor in the transfer transistor group 23-01.

The block address predecoder 21-0 includes a block address signal BLKADD0 from the sequencer 15, and outputs a signal S0 for selecting a block BLK to the selection units 31-00 and 31-01. Any one of the transfer transistor groups 23-00 and 23-01 is selected by the selection units 31-00 and 31-01. For example, when selecting the block BLK0, an H level is applied to a gate of the transfer transistor group 23-00, and each transfer transistor in the transfer transistor group 23-00 is turned on. As a result, the word lines $WL_0$ to $WL_{15}$ in the block BLK0 are connected to the CG lines $CG_0$ to $CG_{15}$.

The CG lines $CG_0$ to $CG_{15}$ are electrically connected to the CG drivers $13C_0$ to $13C_{15}$ through the transfer transistor groups 23-00 to 23-01.

In Plane 0, an SG line $SGDL_0$ in the string unit $SU_0$ in each block BLK is electrically connected to the SGD driver $13SGD_{00}$ through the transfer transistor groups 23-00 to 23-01. In Plane 0, an SG line $SGSL_0$ in the string unit $SU_0$ in each block BLK is electrically connected to the SGS driver $13SGS_{00}$ through the transfer transistor groups 23-00 to 23-01. In Plane 0, an SG line $SGDL_1$ in the string unit $SU_1$ in each block BLK is electrically connected to the SGD driver $13SGD_{01}$ through the transfer transistor groups 23-00 to 23-01. In Plane 0, an SG line $SGSL_1$ in the string unit $SU_1$ in each block BLK is electrically connected to the SGS driver $13SGS_{01}$ through the transfer transistor groups 23-00 to 23-01.

Next, operations of the control unit 19 according to the present embodiment are described.

The control unit 19 has a function of controlling operations of the entire nonvolatile semiconductor memory 1. The control unit 19 includes the sequencer 15, the command user interface 16, the registers 20a and 20b, and the registers 24a0 to 24d0 and 24a1 to 24d1.

Based on a command and an address that is supplied from the command user interface 16, the sequencer 15 performs an operation sequence for a data writing operation, a data reading operation, and a data erasure operation.

In order to perform the operation sequence, the sequencer 15 controls operation of each block of the nonvolatile semiconductor memory 1. As illustrated in FIG. 6, the sequencer 15 supplies a block address signal BLKADD0 to the block address predecoder 21-0 in Plane 0, supplies a block address signal BLKADD1 to a block address predecoder 21-1 in Plane 1, and supplies the string unit address signals SUADD0 and SUADD1 to the driver 13.

During the data writing operation, the data reading operation, and the like, a command, data, and an address are supplied to the nonvolatile semiconductor memory 1 from the outside through the I/O interface 12. An example of an address according to the present embodiment is described with FIG. 8.

Figure 8:
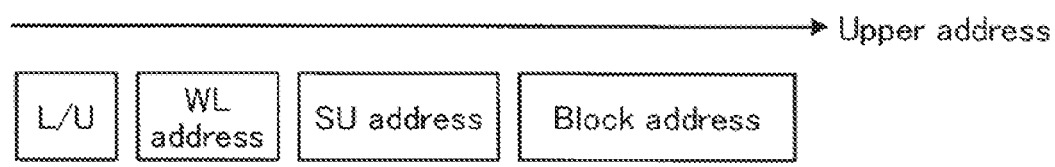
FIG. 8 conceptually illustrates a structure of an address according to the first embodiment.

FIG. 8 conceptually illustrates a structure of an address according to the present embodiment.

As illustrated in FIG. 8, the sequencer 15 sequentially receives a lower-level/higher-level page address (L/U), a word line address (WL Address), a string unit address (SU Address), and a block address (Block Address).

As illustrated in FIG. 6, the sequencer 15 supplies the bock address signals BLKADD0 and the BLKADD1 to the block address predecoder 21-0 and 21-1, respectively. Furthermore, the sequencer 15 supplies the string unit address signals SUADD0 and SUADD1 and a word line address signal WLA to the driver 13. At this point, the signal SUADD0 is supplied to Plane 0, and the signal SUADD1 is supplied to Plane 1. In the same manner, the signal BLKADD0 is supplied to Plane 0, and the signal BLKADD1 is supplied to Plane 1. Details will be described below.

A word line address signal WLADD is assumed to use a word line address signal that is common to a plurality of planes. Moreover, the word line address signal WLADD may be set to be common between the plurality of planes, and the same word line WL may be set to be selected commonly for the plurality of planes. Furthermore, the word line address signal WLADD may be set to be changed for every plane and the word line WL that varies from one plane to another may be set to be selected.

The block address predecoder 21-0 receives the block address signal BLKADD0 from the sequencer 15. The block address signal BLKADD0 includes information for selecting a specific block from the memory cell array 2 in Plane 0. The block address predecoder 21-0 decodes the block address signal BLKADD0, and outputs the signal S0 to the selection units 31-00 and 31-01 so that a specific block BLK is selected. At this point, the signal S0 is a signal for selecting any block BLK in Plane 0.

For example, if the block BLK0 is selected, the transfer transistor group 23-00 is turned on through the selection units 31-00 and 31-01, the level shifters 22-00 and 22-01.

The level shifter 22-00 receives a necessary voltage VRDEC from the selection unit 31-00. The selection unit 31-00 receives a necessary voltage from a voltage generation circuit 14, and generates the voltage VRDEC. The selection unit 31-00, for example, is configured as a portion of a function of the voltage generation circuit 14, and is included in the voltage generation circuit 14.

The sequencer 15 supplies the string unit address signal SUADD0 to the string driver 13STR$_0$, supplies the word line address signal WLADD to the CG drivers 13C$_0$ to 13C$_{15}$, and selects a specific string unit SU and a specific word line WL. The string unit address signal SUADD0 includes information for selecting a specific string unit SU from the memory cell array 2 in Plane 0.

For example, if the string unit SU$_0$ in the block BLK0 is selected, an H level is transmitted to the SG lines SGSL$_0$ and SGDL$_0$, and transmits an L level to the SG lines SGSL$_1$ and SGDL$_1$ that correspond to a different string unit SU$_1$.

As a result, a selection gate transistor in the string unit SU$_0$ is turned on, and a selection gate transistor in the string unit SU$_1$ is turned off.

As described above, this is true for Plane 1 except for the following one respect. That is, the block address predecoder 21-1 for Plane 1 receives the block address signal BLKADD1. The block address signal BLKADD1 includes information for selecting a specific block from the memory cell array 2 in Plane 2. The block address predecoder 21-1 decodes the block address signal BLKADD1, and outputs a signal S1 to the selection units 31-10 and 31-11 so that a specific block BLK is selected. At this point, the signal S1 is a signal for selecting any block BLK in Plane 1.

The sequencer 15 supplies a string unit address signal SUADD1 to a string driver 13STR$_1$, supplies the word line address signal WLADD to the CG drivers 13C$_0$ to 13C$_{15}$, and selects a specific string unit SU and a specific word line WL. At this point, the string unit address signal SUADD1 includes information for selecting a specific string unit SU from the memory cell array 2 in Plane 1.

For example, if the string unit SU$_0$ in the block BLK0 is selected, an H level is transmitted to the SG lines SGSL$_0$ and SGDL$_0$, and transmits an L level to the SG lines SGSL$_1$ and SGSL$_1$ that correspond to a different string unit SU$_1$.

As a result, the selection gate transistor in the string unit SU$_0$ is turned on, and the selection gate transistor in the string unit SU$_1$ is turned off.

The block address signal BLKADD1 is different from the block address signal BLKADD0, and the string unit address signal SUADD0 is different from the string unit address signal SUADD1. For that reason, the string unit SU that is selected in the Plane 0 and the string unit SU that is selected in Plane 1 are independent of each other. Moreover, according to the present embodiment, the block address signals BLKADD0 and BLKADD1 are different from each other, and the string unit address signals SUADD0 and SUADD1 are different from each other, but there is no limitation to contents of these signals. For example, the string unit address signal SUADD0 and the string unit address signal SUADD1 may be the same.

The above describes the nonvolatile semiconductor memory 1 that has two planes. However, a nonvolatile semiconductor memory having three or more Planes can also be configured based on the principle described above.

Figure 9:
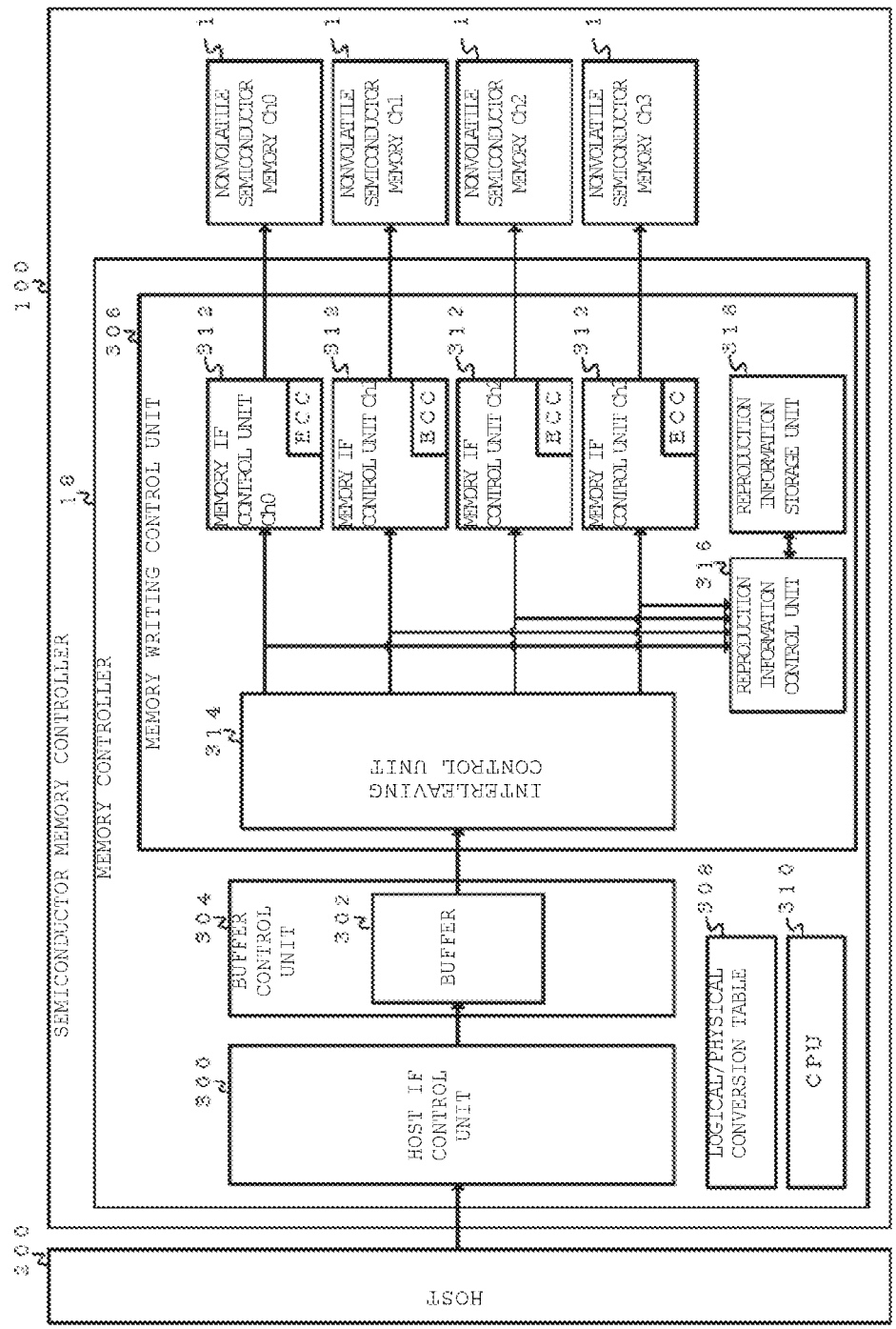
FIG. 9 is a block diagram of a memory controller according to the first embodiment.

Next, a configuration of the memory controller 18 according to the present embodiment is described with reference to FIG. 9.

The memory controller 18 includes a host interface (IF) control unit 300, a buffer control unit 304, a memory writing control unit 306, a logical/physical conversion table 308, and a Central Processing Unit (CPU) 310.

The host IF control unit 300 performs interpretation or execution of a command that is received from the host 200. The buffer control unit 304 performs control or the like of a buffer 302. The memory writing control unit 306 controls writing of data to the nonvolatile semiconductor memory 1. The logical/physical conversion table 308 performs mapping between a logical address that is designated in a command from the host 200 and a physical address of the nonvolatile semiconductor memory 1. The CPU 310 performs control of the entire semiconductor memory device 100 based on firmware (FW).

The buffer 302 according to the present embodiment is a memory of Static Random Access Memories (SRAMs), but different types of memories, such as Dynamic Random Access Memories (DRAMs), may be employed for the buffer 302.

The memory writing control unit 306 includes a memory interface (IF) control unit 312 (which, in some cases, is hereinafter expressed as memory IF control units Ch0 to Ch3) that is connected to each of the nonvolatile semiconductor memory channels Ch0 to Ch3, an interleaving control unit 314, a reproduction information control unit 316, and a reproduction information storage unit 318.

The memory IF control unit 312 controls an operation of writing data to the nonvolatile semiconductor memory 1, operations of reading and erasing data from the nonvolatile semiconductor memory 1, and the like. The interleaving control unit 314 transfers data read from the buffer 302, to each memory IF control unit 312. The reproduction information control unit 316 generates and manages reproduction information for being able to reproduce data written to the nonvolatile semiconductor memory 1. The reproduction information storage unit 318 stores (retains) the reproduction information. The reproduction information will be described below. The reproduction information may be stored in the buffer 302.

The memory control unit 312 has a function of attaching an error correction code to data written to the nonvolatile semiconductor memory 1 and performing an error correction on data read from the nonvolatile semiconductor memory 1. That is, the memory IF control unit 312 includes an error correction code (ECC) control unit.

The buffer 302 and the CPU 310 may be configured as a separate semiconductor integrated circuit, without being built into the memory controller 18. Furthermore, it is possible that some or all of the functions which, in the following description, are performed in accordance with the FW may be performed also by dedicated hardware (HW), and it is possible that some or all of the functions which are performed by HW may be performed in accordance with the FW.

Next, control of writing of data to the nonvolatile semiconductor memory 1 by the memory controller 18 is described with reference to FIG. 10.

Figure 10:
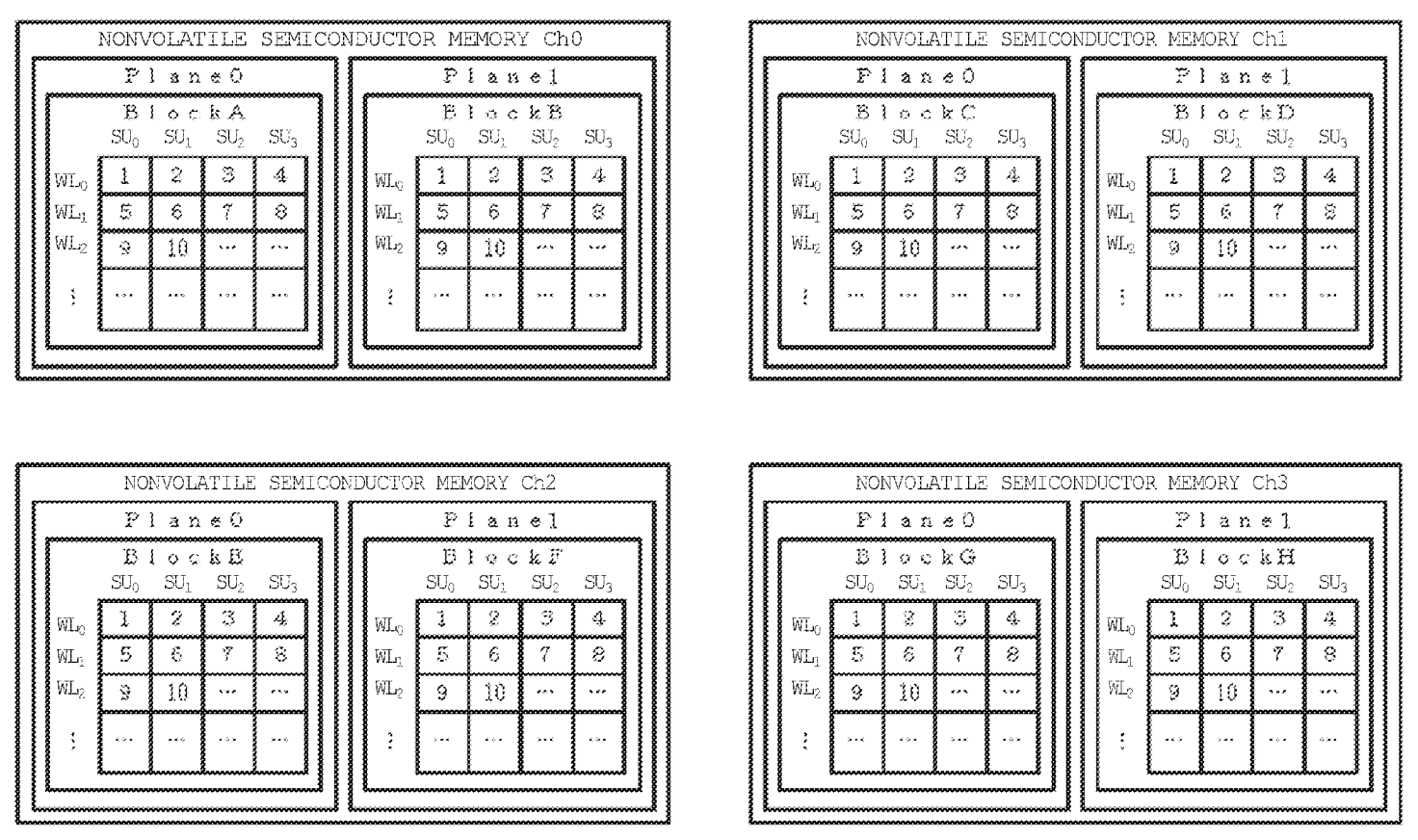

In FIG. 10, each nonvolatile semiconductor memory 1 includes two Planes (Plane 0 and Plane 1). Each Plane includes a plurality of blocks. Each block includes four string units ($SU_0$ to $SU_3$).

The memory controller 18 controls the writing of data, collectively for memory cells included in the common string unit SU, among memory cells that share the word line WL, as one unit. This unit is hereinafter referred to as a WLSU. The WLSU includes a plurality of pages.

A time period for writing (programming) data to the memory cells of the nonvolatile semiconductor memory 1 is longer than a time period for transferring data from the memory controller to the nonvolatile semiconductor memory 1 (more specifically to the page buffer 4). For this reason, the memory controller 18 transfers data to a different nonvolatile semiconductor memory 1 during the time period (tProg) for writing data to memory cells of one nonvolatile semiconductor memory 1, and thus improves writing performance of the entire semiconductor memory device 100. Within each nonvolatile semiconductor memory 1, data are written at the same time to memory cells of each of Plane 0 and Plane 1 that share the driver 13.

According to the present embodiment, the memory controller 18 first writes data for a WLSU ($WL_0$, $SU_0$) within each block and next writes data for a WLSU ($WL_0$, $SU_1$). Thereafter, the memory controller 18 sequentially writes pieces of data for ($WL_0$, $SU_2$), ($WL_0$, $SU_3$), ($WL_1$, $SU_0$), ($WL_1$, $SU_2$), and so forth. WLSUs that are illustrated in FIG. 10 are sequentially numbered in the order in which data are written. For example, Plane 0, Block A, and WLSU ($WL_1$, $SU_1$) in the nonvolatile semiconductor memory Ch0 will be expressed below as [Ch0, Plane 0, Block A, WLSU #6].

Data are written at the same time to WLSUs that have the same number. That is, data are written at the same time to a total of eight WLSUs in Plane 0 and Plane 1 of each of the four nonvolatile semiconductor memories 1.

The control unit 19 checks whether or not data received from the memory controller 18 are correctly programed to memory cells (program verification). A result of the program verification is saved, for example, in the register 20a. The memory controller 18 can know whether or not the writing of data to the memory cells of the nonvolatile semiconductor memory 1 fails, by reading the result of the program verification.

Next, operation of the reproduction information control unit 316 is described with reference to FIG. 11.

The reproduction information control unit 316 generates the reproduction information for being able to reproduce data that are written to each nonvolatile semiconductor memory 1. The reproduction information control unit 316 generates the reproduction information by performing an exclusive OR (XOR) operation for every Plane on the data written to each WLSU. The generated reproduction information is stored in the reproduction information storage unit 318 before each piece of data is transferred to each nonvolatile semiconductor memory 1.

Figure 11:
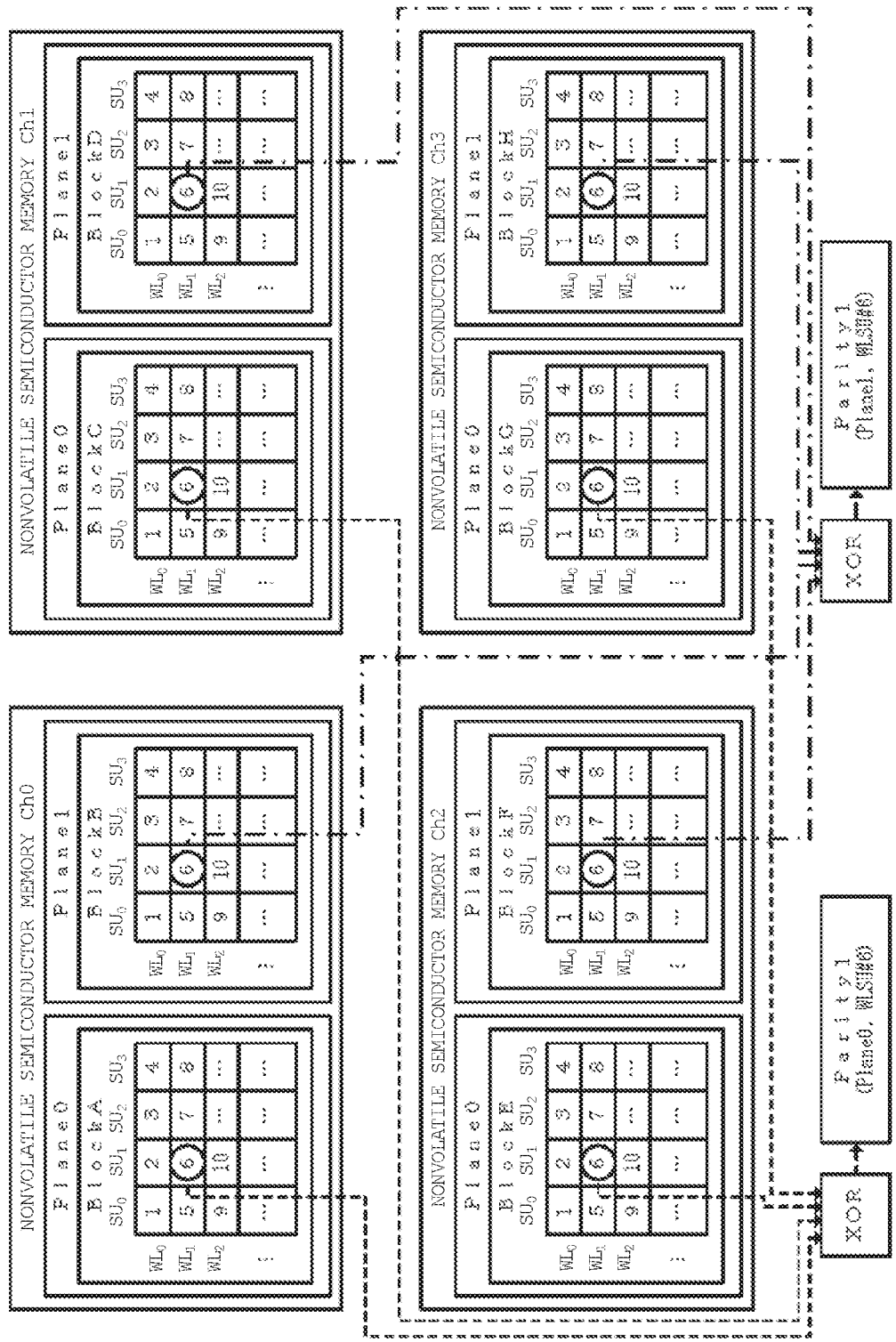
FIG. 11 illustrates operation of a reproduction information control unit according to the first embodiment.

In FIG. 11, the XOR operation is performed on data written to [Ch0, Plane 0, Block A, WLSU #6], data written to [Ch1, Plane 0, Block C, WLSU #6], data written to [Ch2, Plane 0, Block E, WLSU #6], and data written to [Ch3, Plane 0, Block G, WLSU #6], and then the reproduction information Parity 1 (Plane 0, WLSU #6) is generated. Furthermore, the XOR operation is performed on data written to [Ch0, Plane 1, Block B, WLSU #6], data written to [Ch1, Plane 1, Block D, WLSU #6], data written to [Ch2, Plane 1, Block F, WLSU #6], and data written to [Ch3, Plane 1, Block H, WLSU #6], and then the reproduction information Parity 1 (Plane 1, WLSU #6) is generated.

Recently, there is an advance in breaking a process of manufacturing the nonvolatile semiconductor memory 1 into sub-processes. As a result, when writing data to a memory cell, there is an increased concern that electric discharge and like will occur between word lines and thus a short circuit will occur between two adjacent word lines. A range of memory cells, in which there is a likelihood that data will be lost when the short circuit occurs between the word lines, is described with reference to FIG. 12. Moreover, the short circuit will be described below as occurring between word lines that are adjacent to each other. However, the following description can apply also to a case where the short circuit occurs between word lines that are not adjacent to each other.

Figure 12:
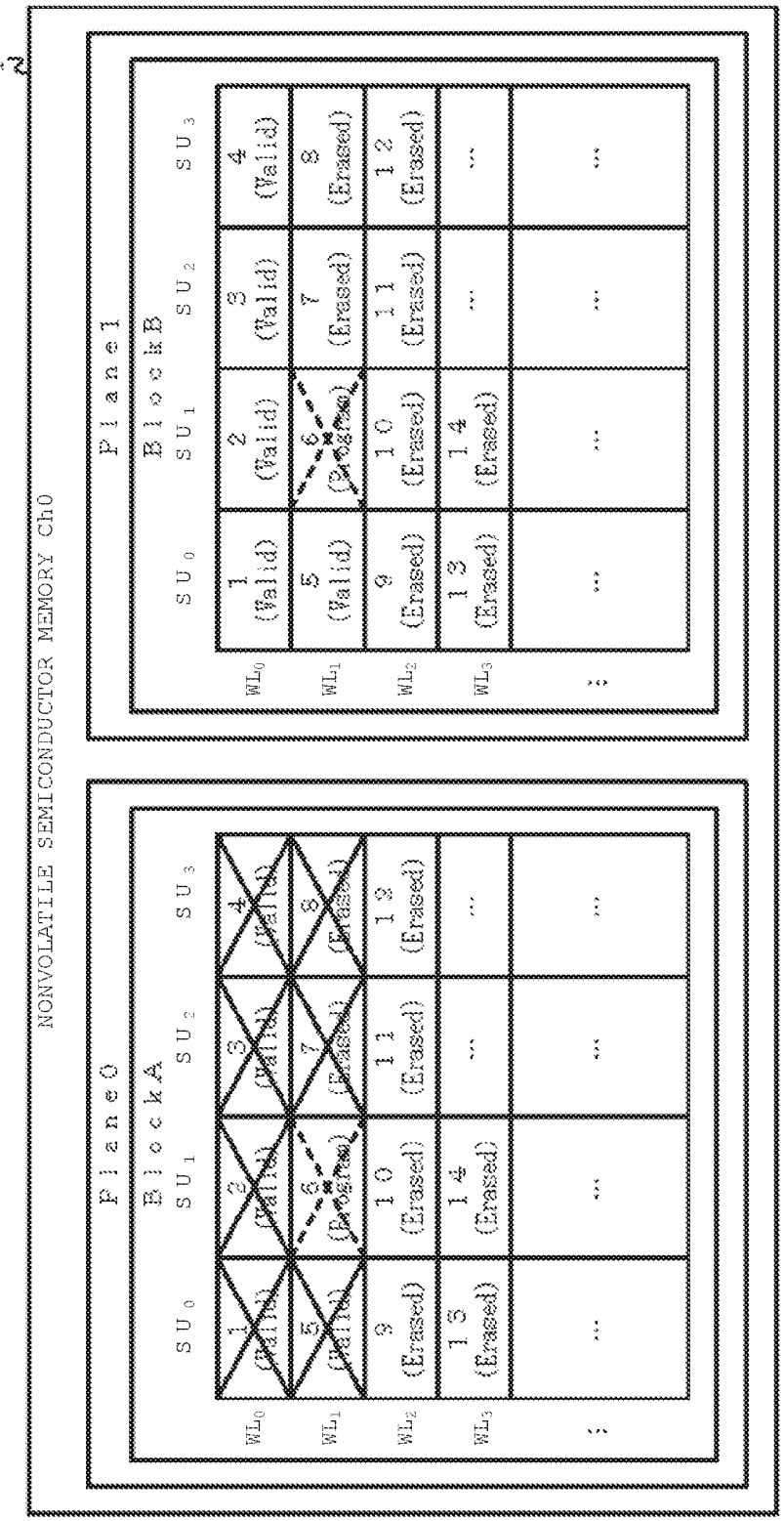
FIG. 12 schematically illustrates a first example of data loss from memory cells according to the first embodiment.

In FIG. 12, it is assumed that, after valid data are written to memory cells WLSU #1 to WLSU #5, when data are written to a memory cell WLSU #6, the short circuit occurs between $WL_0$ and $WL_1$ in Plane 0 in Black A in the nonvolatile semiconductor memory Ch0. At this time, there is a likelihood that the short circuit occurs in memory cells, [Ch0, Plane 0, Block A, WLSU #1] to [Ch0, Plane 0, Block A, WLSU #5] and thus data are lost. Furthermore, there is a likelihood that the writing of data to a memory cell, [Ch0, Plane 0, Block A, WLSU #6] fail. There is a likelihood that the short circuit will occur also in memory cells [Ch0, Plane 0, Block A, WLSU #7] to [Ch0, Plane 0, Block A, WLSU #8], but effective data has not yet to be written to these memory cells WLSUs.

Additionally, there is a likelihood that the writing of data to a memory cell [Ch0, Plane 1, Block B, WLSU #6] fails, to which data are to be written at the same time as data are written to the memory cell [Ch0, Plane 0, Block A, WLSU #6] fails as well. As described above, each Plane shares the driver 13. The driver 13 has the capability to drive two word lines (for example, $WL_1$ in Block A in Plane 0 and $WL_1$ in Block B in Plane 1). However, this is because, when the short circuit occurs between $WL_0$ and $WL_1$ in Plane 0 and Block A, the driver 13 has to drive three word lines, $WL_0$ and $WL_1$ in Block A in Plane 0 and $WL_1$ in Block B in Plane 1, and the capability to drive is insufficient.

The loss of data within Plane in which the short circuit occurs between word lines and the failure of the writing of data ([Ch0, Plane 0, Block A, WLSU #1] to [Ch0, Plane 0, Block A, WLSU #6] in FIG. 12) are referred to as a first issue, and the failure of writing data within Plane in which the short circuit does not occur between word lines ([Ch0, Plane 1, Block B, WLSU #6] in FIG. 12) is referred to as a second issue.

Next, a method of reproducing data using the reproduction information is described with reference to FIG. 13.

Figure 13:
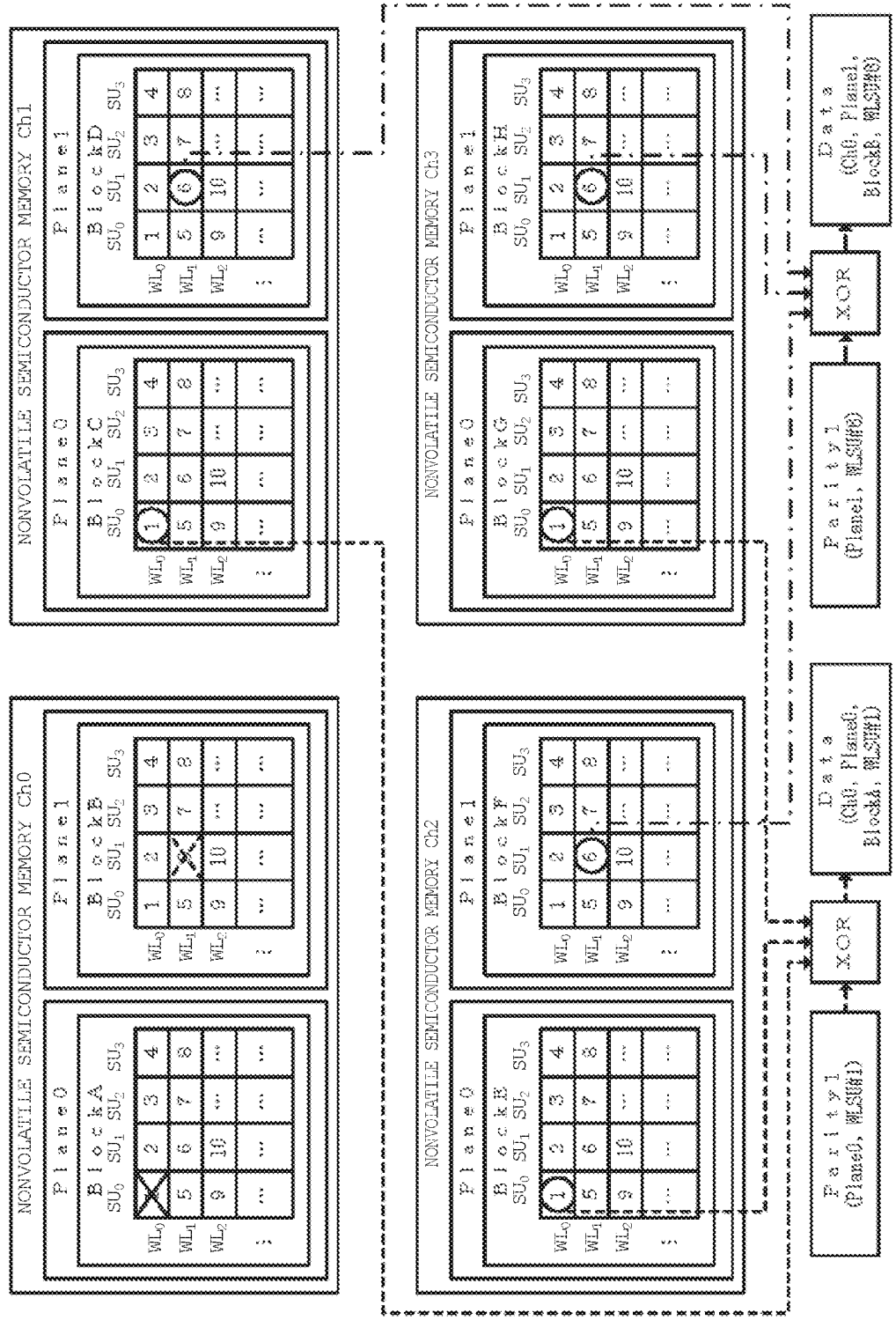
FIG. 13 schematically illustrates a method of reproducing data according to the first embodiment.

In FIG. 13, as in FIG. 12, it is assumed that, after valid data are written to the memory cells WLSU #1 to WLSU #5, when data are written to the memory cell WLSU #6, the short circuit occurs between $WL_0$ and $WL_1$ in Plane 0 in Black A in the nonvolatile semiconductor memory Ch0. In FIG. 13, a mark X is given to only [Ch0, Plane 0, Block A, WLSU #1]. However, as described above, the first issue occurs in [Ch0, Plane 0, Block A, WLSU #1] to [Ch0, Plane 0, Block A, WLSU #6].

First, reproduction of data in [Ch0, Plane 0, Block A, WLSU #1], which has a likelihood of being lost due to the first issue is described.

When the writing of data to [Ch0, Plane 0, Block A, WLSU #6] failed, the memory controller 18 reads data from [Ch0, Plane 0, Block A, WLSU #1] that is connected to an adjacent word line ($WL_0$). As a result of reading the data, the memory controller 18 recognizes that the data in [Ch0, Plane 0, Block A, WLSU #1] cannot be correctly read, that is, that the data are lost.

At this time, the memory controller 18 reads pieces of data from [Ch1, Plane 0, Block C, WLSU #1], [Ch2, Plane 0, Block E, WLSU #1], and [Ch3, Plane 0, Block G, WLSU #1]. Additionally, the memory controller 18 reads the reproduction information Parity 1 (Plane 0, WLSU #1) from the reproduction information storage unit 318. Then, each piece of data and the reproduction information that are read are stored, for example, in a buffer 302. Then, the memory controller 18 reproduces data in [Ch0, Plane 0, Block A, WLSU #1] by performing the XOR operation on the data and the reproduction information that are read and stored in the buffer 302.

The reproduced data are written to another WLSU (for example, [Ch0, Plane 0, Block A, WLSU #9]), other than [Ch0, Plane 0, Block A, WLSU #1]. Information on the WLSU to which data are written is recorded in the logical/physical conversion table 308.

In the same manner, the memory controller 18 reproduces pieces of data of [Ch0, Plane 0, Block A, WLSU #2] to [Ch0, Plane 0, Block A, WLSU #6].

Next, reproduction of data in [Ch0, Plane 1, Block B, WLSU #6], in which there is a likelihood that the writing of data fails due to the second issue, is described.

When the writing of data to [Ch0, Plane 0, Block A, WLSU #6] failed, the memory controller 18 reads data from [Ch0, Plane 1, Block B, WLSU #6] in different Plane that shares the driver 13. As a result of reading the data, the memory controller 18 recognizes that the data in [Ch0, Plane 1, Block B, WLSU #6] cannot be correctly read, that is, that the writing of the data failed.

At this time, the memory controller 18 reads pieces of data from [Ch1, Plane 1, Block D, WLSU #6], [Ch2, Plane 1, Block F, WLSU #6], and [Ch3, Plane 1, Block H, WLSU #6]. Additionally, the memory controller 18 reads the reproduction information Parity 1 (Plane 1, WLSU #6) from the reproduction information storage unit 318. Then, each piece of data and the reproduction information that are read are stored, for example, in the buffer 302. Then, the memory controller 18 reproduces the data in [Ch0, Plane 1, Block B, WLSU #6] by performing the XOR operation on the data and the reproduction information that are read and stored in the buffer 302.

The reproduced data are written to another WLSU (for example, [Ch0, Plane 1, Block B, WLSU #10]), other than [Ch0, Plane 1, Block B, WLSU #6]. Also, information on the WLSU to which data are written is recorded in the logical/physical conversion table 308.

Here, the reproduction information may not be generated based on data that are written to each WLSU of the nonvolatile semiconductor memory 1 in a different channel. That is, although data are written to a WLSU of the nonvolatile semiconductor memory 1 in the same channel, this WLSU may be a WLSU that belongs to a word line on which the first issue and the second issue have no influence. Furthermore, a type of operation for generating the reproduction information is not limited to the exclusive OR. Additionally, the reproduction information may be data (user data) itself that are written to each nonvolatile semiconductor memory 1.

Figure 14:
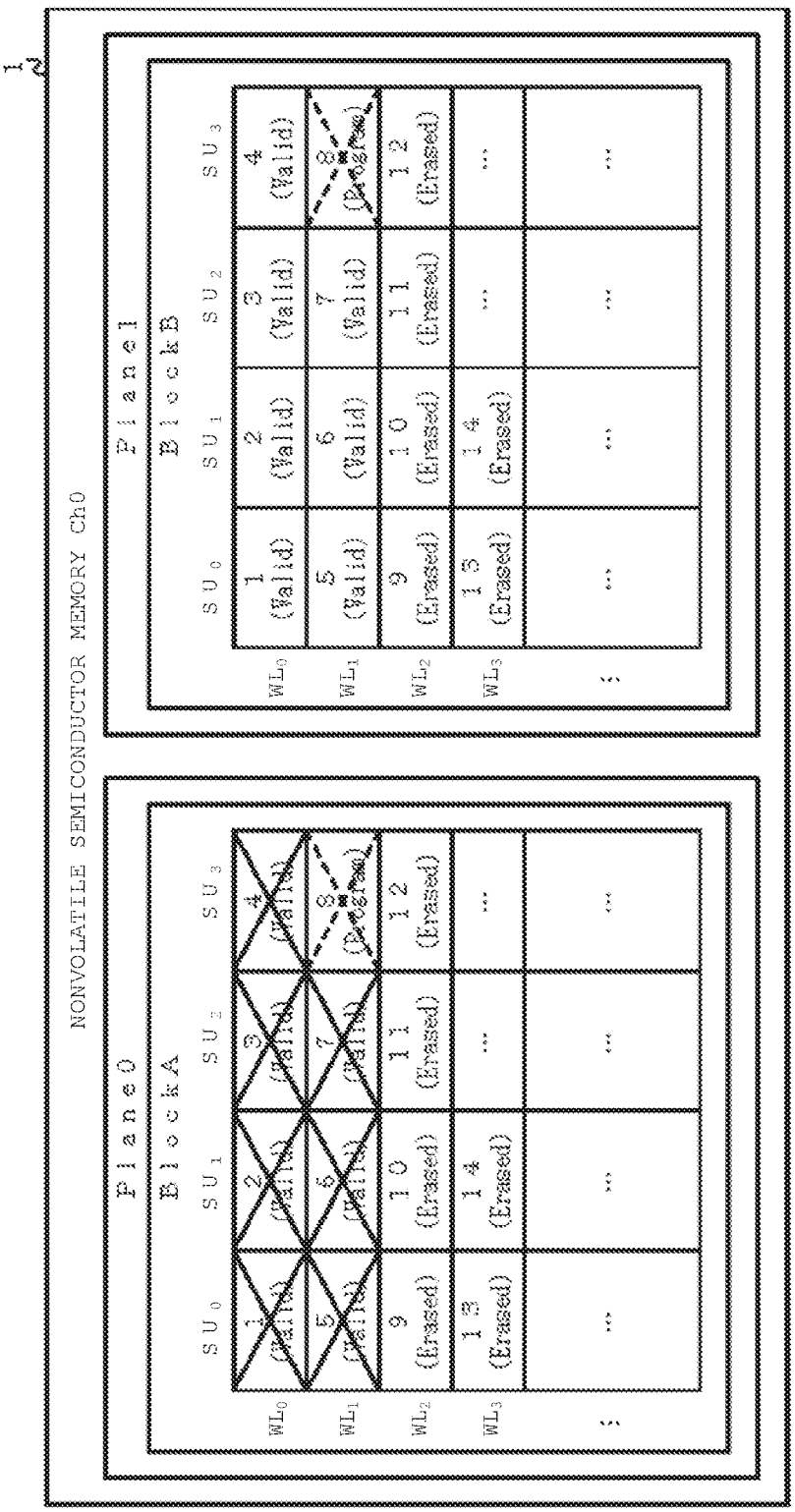
FIG. 14 schematically illustrates a second example of data loss from memory cells according to the first embodiment.

FIG. 14 illustrates another example of memory cells, in which data may be lost when the short circuit occurs between two adjacent word lines.

In FIG. 14, it is assumed that, after valid data are written to memory cells WLSU #1 to WLSU #7, when data are written to a memory cell WLSU #8, the short circuit occurs in $WL_0$ to $WL_1$ in Plane 0 in Block A in the nonvolatile semiconductor memory Ch0.

At this time, there is a likelihood that pieces of data in [Ch0, Plane 0, Block A, WLSU #1] to [Ch0, Plane 0, Block A, WLSU #7] are lost due to the first issue. Furthermore, there is a likelihood that the writing of data to [Ch0, Plane 0, Block A, WLSU #8] fails due to the first issue. Additionally, there is a likelihood that the writing of data to [Ch0, Plane 1, Block B, WLSU #8] fails due to the second issue. FIG. 14 illustrates a case where the number of WLSUs in which data may be lost due to the first issue is the greatest.

Figure 15:
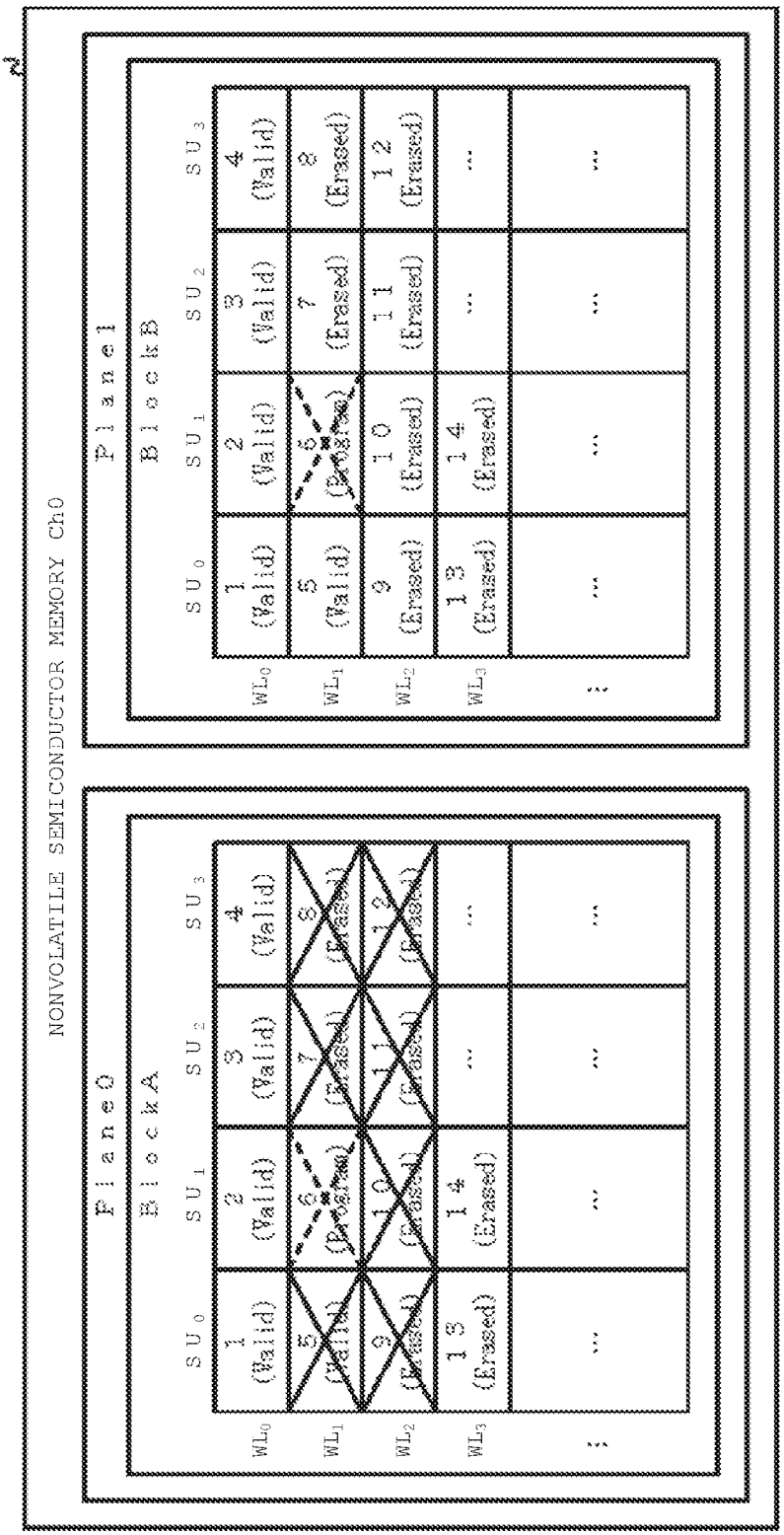
FIG. 15 schematically illustrates a third example of data loss from memory cells according to the first embodiment.

FIG. 15 illustrates another example of memory cells, in which data may be lost when the short circuit occurs between two adjacent word lines.

In FIG. 15, it is assumed that, after valid data are written to the memory cells WLSU #1 to WLSU #5, when data are written to the memory cell WLSU #6, the short circuit occurs between $WL_1$ and $WL_2$ in Plane 0 in Block A in the nonvolatile semiconductor memory Ch0. That is, in FIG. 15, it is assumed that the short circuit occurs in a word line connected to memory cells to which data are going to be written and a word line connected to memory cells to which valid data has not yet to be written.

At this time, there is a likelihood that data in [Ch0, Plane 0, Block A, WLSU #5] are lost due to the first issue.

Furthermore, there is a likelihood that the writing of data to [Ch0, Plane 0, Block A, WLSU #6] fails due to the first issue. Additionally, there is a likelihood that the writing of data to [Ch0, Plane 1, Block B, WLSU #6] fails due to the second issue.

Figure 16:
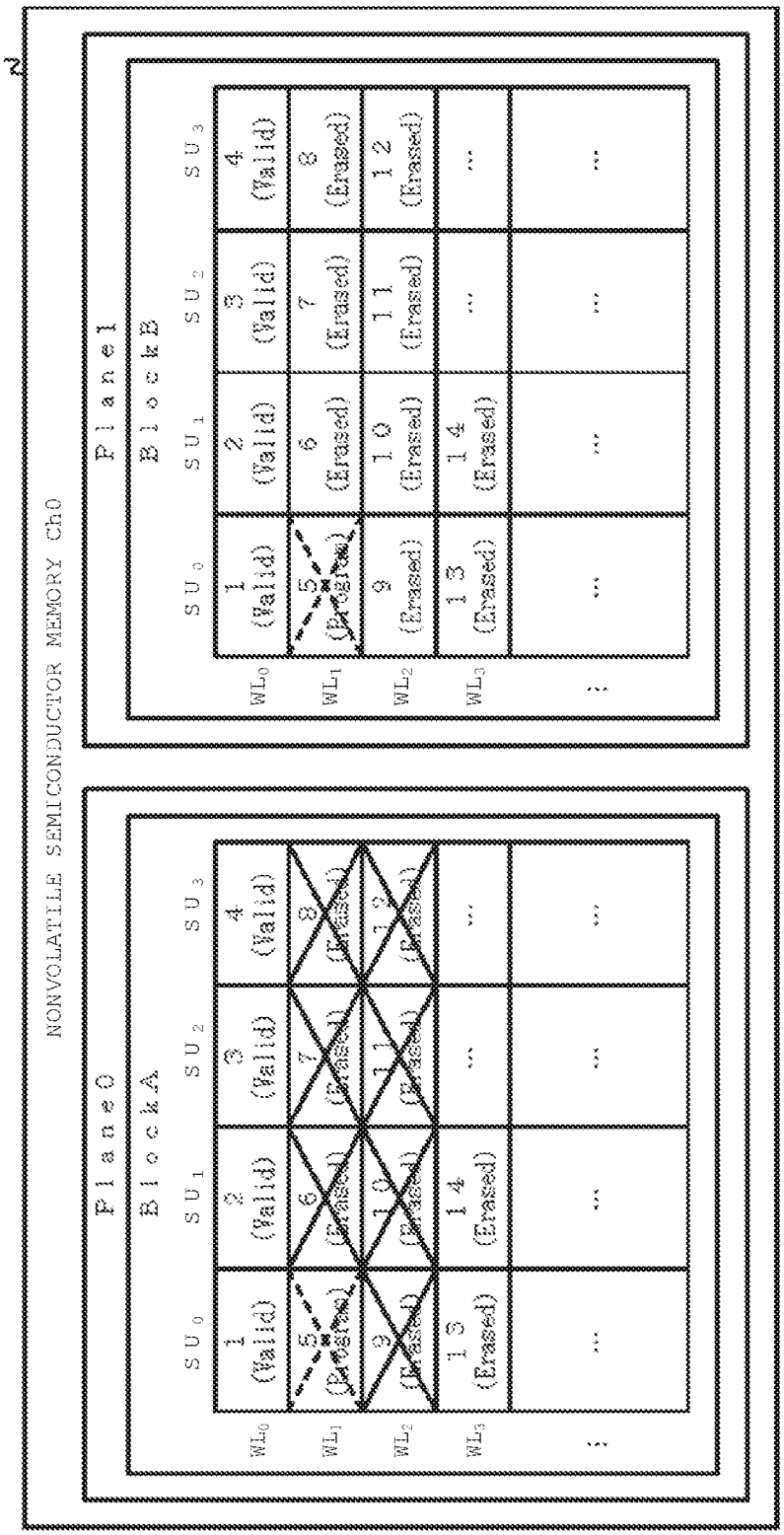
FIG. 16 schematically illustrates a fourth example of data loss from memory cells according to the first embodiment.

FIG. 16 illustrates another example of memory cells, in which data may be lost when the short circuit occurs between two adjacent word lines.

In FIG. 15, it is assumed that, after valid data are written to memory cells WLSU #1 to WLSU #4, when data are written to the memory cell WLSU #5, the short circuit occurs between $WL_1$ and $WL_2$ in Plane 0 in Block A in the nonvolatile semiconductor memory Ch0.

At this time, there is no WLSU in which data may be lost due to the first issue. Furthermore, there is a likelihood that the writing of data to [Ch0, Plane 0, Block A, WLSU #5] fails due to the first issue. Additionally, there is a likelihood that the writing of data to [Ch0, Plane 1, Block B, WLSU #5] fails due to the second issue.

Figure 17:
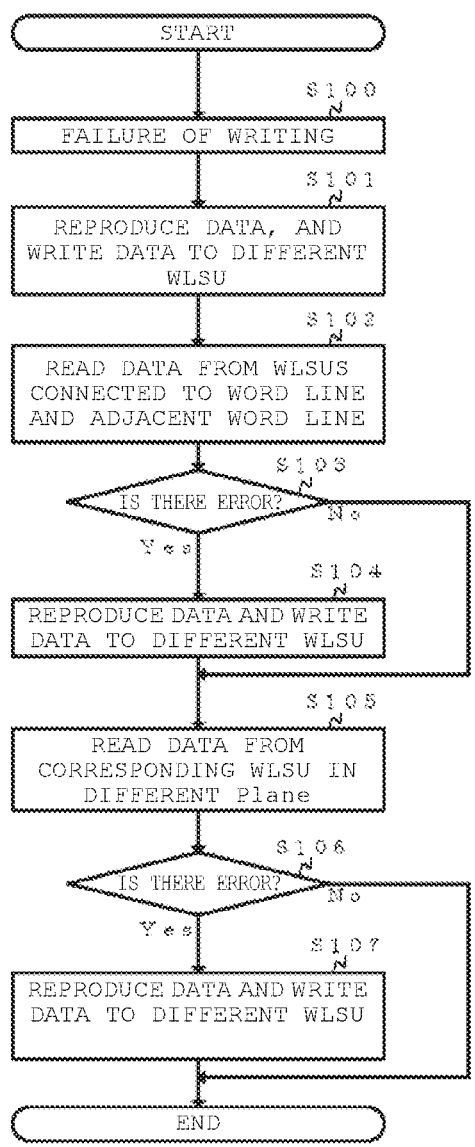
FIG. 17 is a flow chart illustrating a procedure for reproducing data according to the first embodiment.

Next, a procedure in which the memory controller 18 reproduces data when the writing of data fails is described with reference to FIG. 17.

When the writing of data to a memory cell WLSU fails (S100), the memory controller 18 reproduces the data, using data read from the nonvolatile semiconductor memory 1 in a different channel and the reproduction information parity 1 (S101). The memory controller 18 writes the reproduced data to a WLSU other than the WLSU, at which the writing failed (S101).

Next, the memory controller 18 reads pieces of data from different WLSU that belongs to a word line connected to the memory cell on which data writing failed, and a WLSU connected to a word line that is adjacent to such a word line (S102). If read data include an error (Yes in S103), that is, if the data are lost due to the first issue, the memory controller 18 reproduces data of the WLSU and writes the reproduced data to another WLSU (S104).

Next, the memory controller 18 reads data from a WLSU in different Plane that corresponds to the WLSU to which the memory cell, the writing of data to which fails, belongs (S105). If read data include an error (Yes in S106), that is, if the writing of data fails due to the second issue, the memory controller 18 reproduces data of the WLSU and writes the reproduced data to another WLSU (S107).

Here, each of Steps S102, S103, S105 and S106 may be omitted. That is, the memory controller 18 may reproduce the data whether or not the data are lost and whether or not the writing of data fails. Furthermore, if it is determined that the memory cell, the WLSU in which the loss of the data or the failure of the writing of data occurs is not physically destroyed, the memory controller 18 may write the reproduced data to the same WLSU, in each of Steps S101 and S104, and S107.

Figure 18:
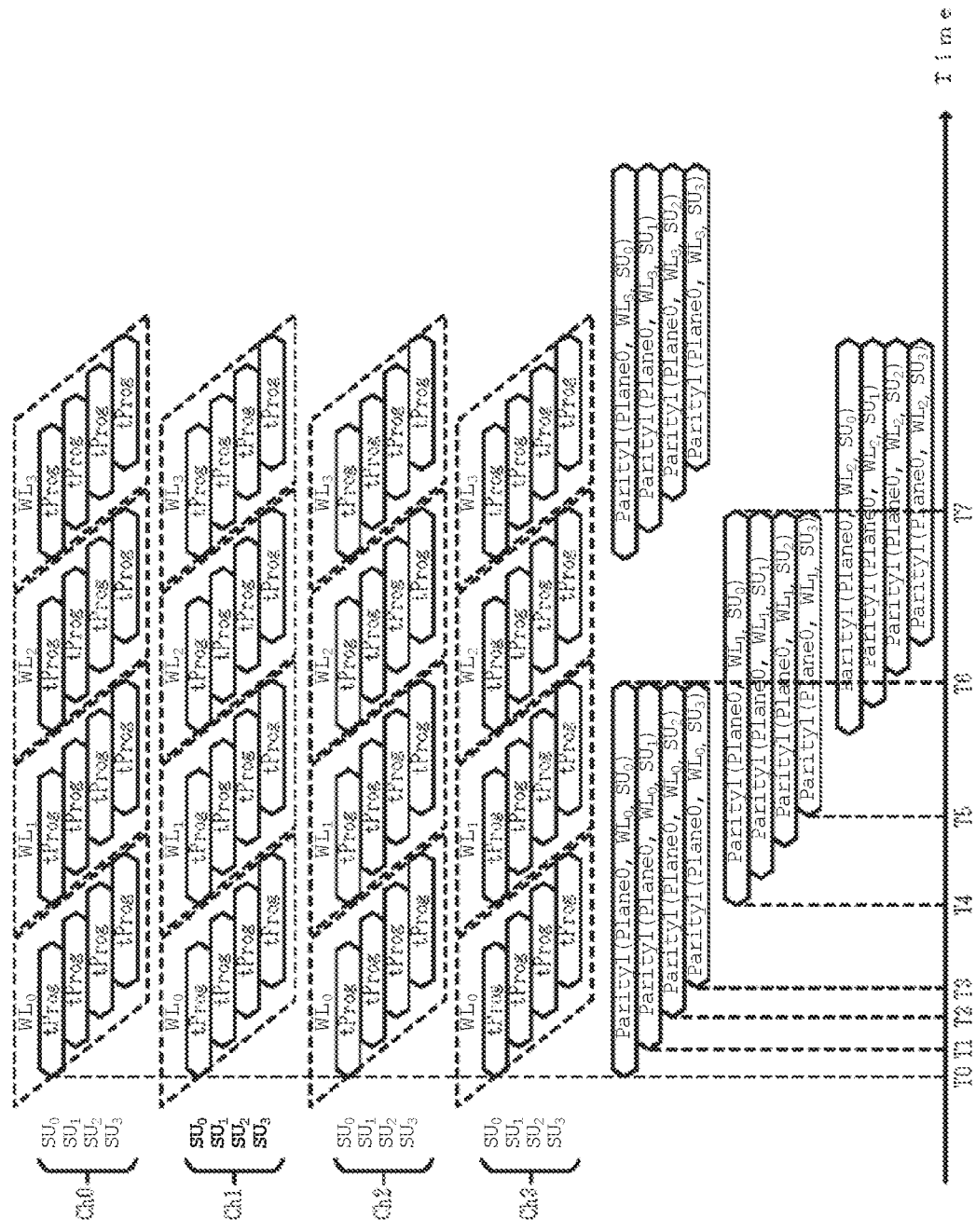
FIG. 18 is a timing chart illustrating generation and retention of reproduction information according to the first embodiment.

Next, a timing of generation and retention of the reproduction information Parity 1 is described with reference to FIG. 18. In FIG. 18, for example, the reproduction information Parity 1 (Plane 0, WLSU #1) is referred to as Parity 1 (Plane 0, $WL_0$, $SU_0$). Furthermore, an illustration of the reproduction information Parity 1 relating to Plane 1 is omitted. Additionally, the time required for transferring data from the memory controller 18 to each nonvolatile semiconductor memory 1 is also omitted.

At time T0, ($WL_0$, $SU_0$), data to be written to WLSU #1 are transferred from the memory controller 18 to each nonvolatile semiconductor memory 1. At this time, the memory controller 18 generates the reproduction information Parity 1 (Plane 0, $WL_0$, $SU_0$) and the reproduction information Parity 1 (Plane 1, $WL_0$, $SU_0$) and stores these pieces of generated reproduction information in the reproduction information storage unit 318.

At time T1, ($WL_0$, $SU_1$), data to be written to WLSU #2 are transferred from the memory controller 18 to each nonvolatile semiconductor memory 1. At this time, the memory controller 18 generates the reproduction information Parity 1 (Plane 0, $WL_0$, $SU_1$) and the reproduction information Parity 1 (Plane 1, $WL_0$, $SU_1$), and stores these pieces of generated reproduction information in the reproduction information storage unit 318.

At time T2, ($WL_0$, $SU_2$), data to be written to WLSU #3 are transferred from the memory controller 18 to each nonvolatile semiconductor memory 1. At this time, the memory controller 18 generates the reproduction information Parity 1 (Plane 0, $WL_0$, $SU_2$) and the reproduction information Parity 1 (Plane 1, $WL_0$, $SU_2$) and stores these pieces of generated reproduction information in the reproduction information storage unit 318.

At time T3, ($WL_0$, $SU_3$), data to be written to WLSU #4, are transferred from the memory controller 18 to each nonvolatile semiconductor memory 1. At this time, the memory controller 18 generates the reproduction information Parity 1 (Plane 0, $WL_0$, $SU_3$) and the reproduction information Parity 1 (Plane 1, $WL_0$, $SU_3$) and stores these pieces of generated reproduction information in the reproduction information storage unit 318.

In the same manner, during time T4 to T5, pieces of data that are to be written to ($WL_1$, $SU_0$) to ($WL_1$, $SU_3$) are transferred from the memory controller 18 to each nonvolatile semiconductor memory 1. During this time period, the memory controller 18 generates the reproduction information Parity 1 (Plane 0, $WL_1$, $SU_0$) to the reproduction information Parity 1 (Plane 0, $WL_1$, $SU_3$), and the reproduction information Parity 1 (Plane 1, $WL_1$, $SU_0$) to the reproduction information Parity 1 (Plane 1, $WL_1$, $SU_3$) and stores these pieces of generation reproduction information in the reproduction information storage unit 318.

At time T6, the writing of data to $WL_1$ within each nonvolatile semiconductor memory 1 is completed. At this time, because the data in $WL_0$ will not be lost due to the first issue and the second issue, the memory controller 18 can delete the reproduction information Parity 1 (Plane 0, $WL_0$, $SU_0$) to the reproduction information Parity 1 (Plane 0, $WL_0$, $SU_3$), and the reproduction information Parity 1 (Plane 1, $WL_0$, $SU_0$) to the reproduction information Parity 1 (Plane 1, $WL_0$, $SU_3$) from the reproduction information storage unit 318.

In the same manner, at time T7, the writing of data to $WL_2$ within each nonvolatile semiconductor memory 1 is completed. At this time, because the data in $WL_1$ will not be lost due to the first issue and the second issue, the memory controller 18 can delete the reproduction information Parity 1 (Plane 0, $WL_1$, $SU_0$) to the reproduction information Parity 1 (Plane 0, $WL_1$, $SU_3$), and the reproduction information Parity 1 (Plane 1, $WL_1$, $SU_0$) to the reproduction information Parity 1 (Plane 1, $WL_1$, $SU_3$) from the reproduction information storage unit 318.

According to the semiconductor memory device according to the first embodiment, when the short circuit occurs between two adjacent word lines and loss of data or failure of data writing occurs, because the data can be reproduced, reliability of the semiconductor memory device can be improved.

Second Embodiment

The semiconductor memory device according to the first embodiment generates the reproduction information Parity 1 for every Plane. In contrast, a semiconductor memory device according to a second embodiment generates one piece of reproduction information Parity 2 from two pieces of reproduction information Parity 1.

Figure 19:
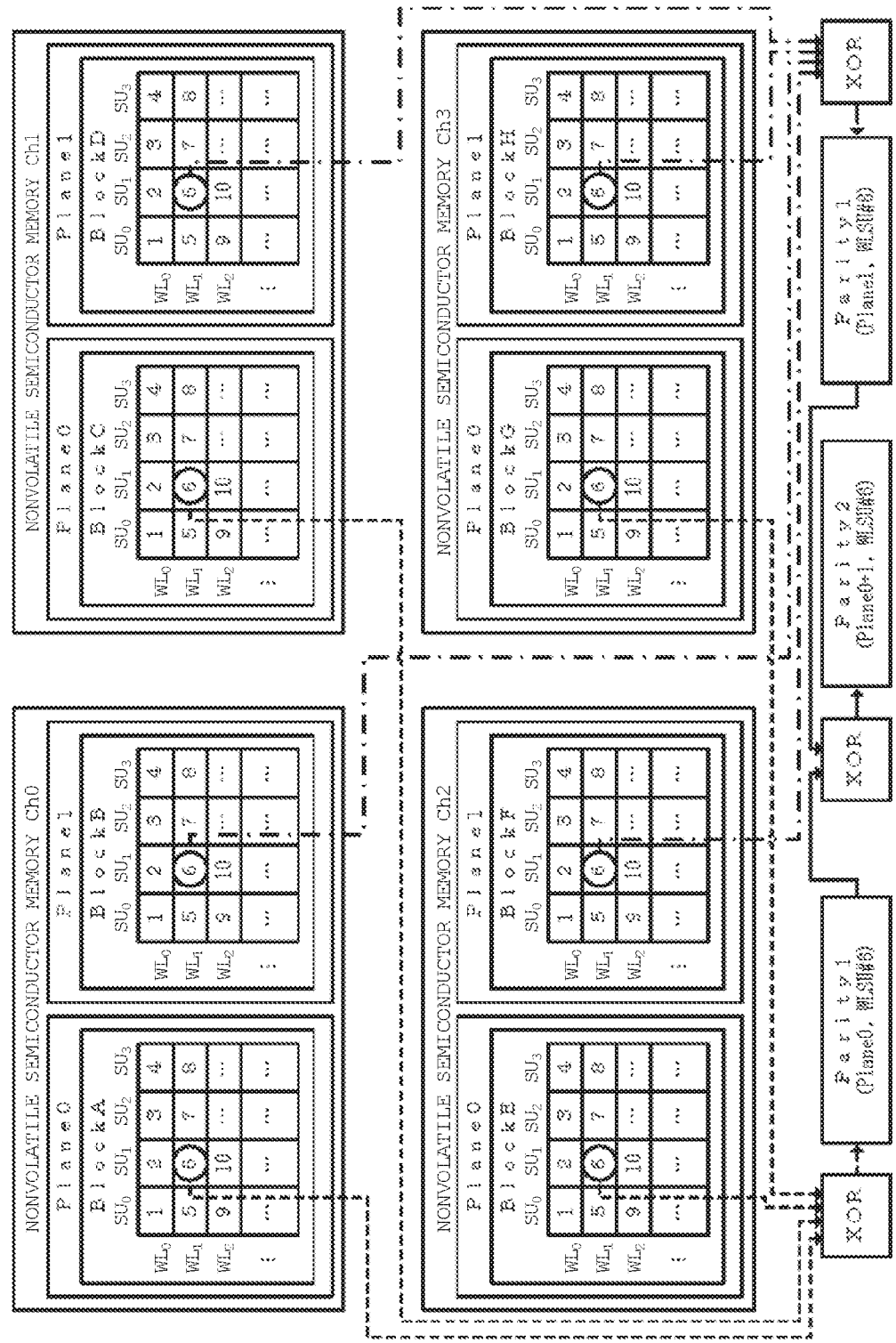
FIG. 19 schematically illustrates an operation of a reproduction information control unit according to a second embodiment.

FIG. 19 illustrates an operation of the reproduction information control unit 316 according to the present embodiment.

In FIG. 19, similarly to FIG. 11, the XOR operation is performed on the data written to [Ch0, Plane 0, Block A, WLSU #6], the data written to [Ch1, Plane 0, Block C, WLSU #6], the data written to [Ch2, Plane 0, Block E, WLSU #6], and the data written to [Ch3, Plane 0, Block G, WLSU #6]. Then, the reproduction information Parity 1 (Plane 0, WLSU #6) is generated. Furthermore, the XOR operation is performed on the data written to [Ch0, Plane 1, Block B, WLSU #6], the data written to [Ch1, Plane 1, Block D, WLSU #6], the data written to [Ch2, Plane 1, Block F, WLSU #6], and the data written to [Ch3, Plane 1, Block H, WLSU #6]. Then, the reproduction information Parity 1 (Plane 1, WLSU #6) is generated.

The reproduction information control unit 316 according to the present embodiment further performs the XOR operation on the reproduction information Parity 1 (Plane 0, WLSU #6) and the reproduction information Parity 1 (Plane 1, WLSU #6), and then generates the reproduction information Parity 2 (Plane 0+1, WLSU #6). Here, it is possible that the reproduction information Parity 2 (Plane 0+1, WLSU #6) is generated directly also by the XOR operation on pieces of data that are written to [Ch0, Plane 0, Block A, WLSU #6] to [Ch0, Plane 1, Block H, WLSU #6], not from the reproduction information Parity 1.

Next, a method of reproducing data using the reproduction information is described with reference to FIG. 20.

Figure 20:
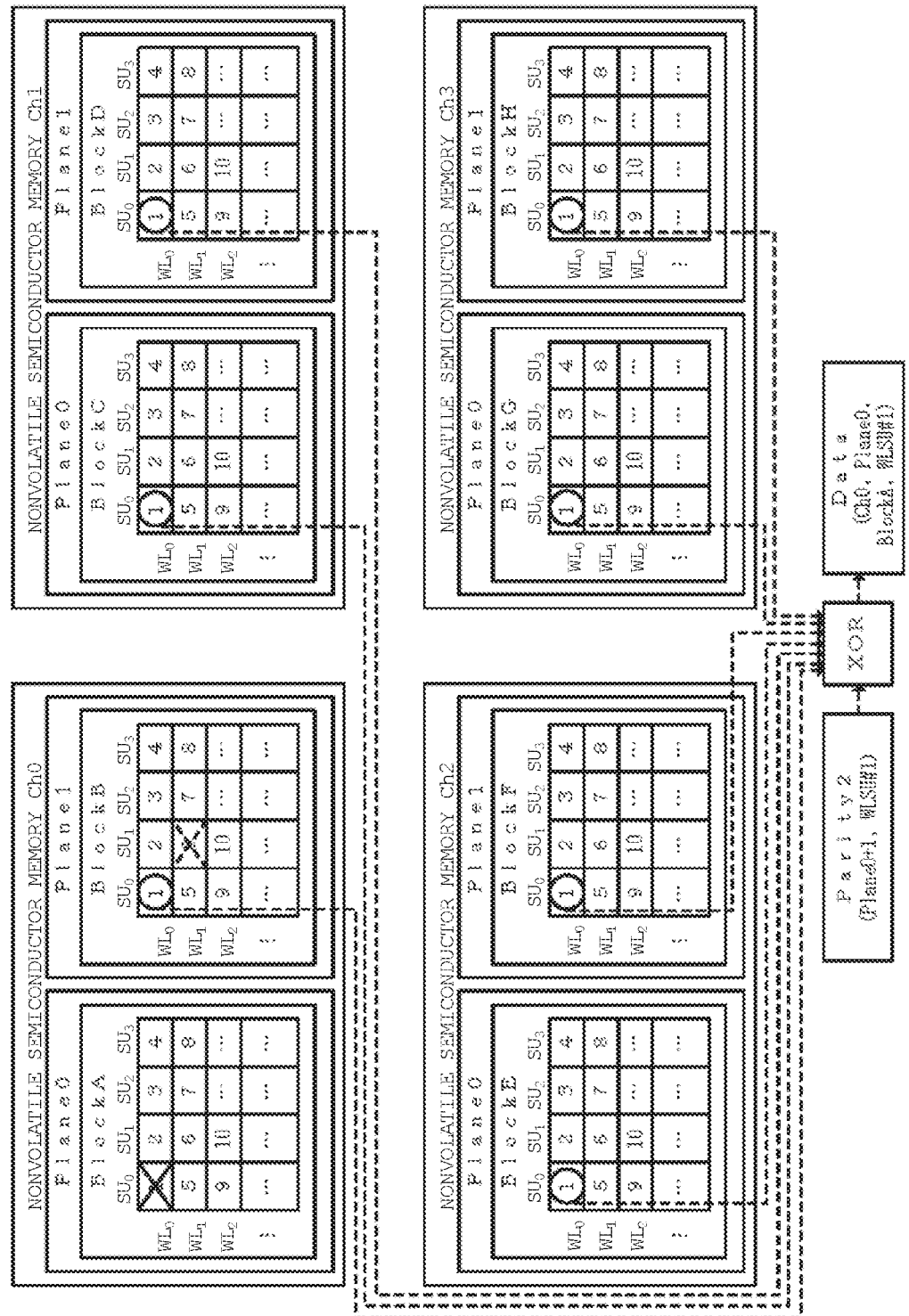
FIG. 20 schematically illustrates a method of reproducing data according to the second embodiment.

In FIG. 20, as in FIG. 13, it is assumed that, after valid data are written to the memory cells WLSU #1 to WLSU #5, when data are written to the memory cell WLSU #6, the short circuit occurs between $WL_0$ and $WL_1$ in Plane 0 in Block A in the nonvolatile semiconductor memory Ch0.

First, the reproduction of data in [Ch0, Plane 0, Block A, WLSU #1], which may be lost due to the first issue, is described.

In reproducing data in [Ch0, Plane 0, Block A, WLSU #1], the memory controller 18 reads pieces of data from [Ch1, Plane 0, Block B, WLSU #1] to [Ch3, Plane 1, Block H, WLSU #1]. Additionally, the memory controller 18 reads the reproduction information Parity 2 (Plane 0+1, WLSU #1) from the reproduction information storage unit 318. Each piece of data and the reproduction information that are read are stored, for example, in the buffer 302. Then, the memory controller 18 can reproduce data in [Ch0, Plane 0, Block A, WLSU #1] by performing the XOR operation on the data and the reproduction information.

In the same manner, the memory controller 18 can reproduce the pieces of data of [Ch0, Plane 0, Block A, WLSU #2] to [Ch0, Plane 0, Block A, WLSU #6].

Reproduction of data in [Ch0, Plane 1, Block B, WLSU #6], of which writing may fail due to the second issue, is the same as in the case of FIG. 13. That is, the memory controller 18 can reproduce data in [Ch0, Plane 1, Block B, WLSU #6] using data in [Ch1, Plane 1, Block D, WLSU #6], data in [Ch2, Plane 1, Block F, WLSU #6], data in [Ch3, Plane 1, Block H, WLSU #6], and the reproduction information Parity 1 (Plane 1, WLSU #6).

A timing of generation and storing of the reproduction information Parity 1 and the reproduction information Parity 2 is described with reference to FIG. 21. Similarly to FIG. 18, in FIG. 21, the reproduction information Parity 1 relating to Plane 1 is also omitted.

In the same manner as in FIG. 18, during time T0 to T3, pieces of data that are to be written to ($WL_0$, $SU_0$) to ($WL_0$, $SU_3$) are transferred from the memory controller 18 to each nonvolatile semiconductor memory 1. At this time, the memory controller 18 generates the reproduction information Parity 1 (Plane 0, $WL_0$, $SU_0$) to the reproduction information Parity 1 (Plane 0, $WL_0$, $SU_3$), and the reproduction information Parity 1 (Plane 1, $WL_0$, $SU_0$) to the reproduction information Parity 1 (Plane 1, $WL_0$, $SU_3$) and stores these pieces of generation reproduction information in the reproduction information storage unit 318.

At time T4, the writing of data to ($WL_0$, $SU_0$) in each nonvolatile semiconductor memory 1 is completed. At this time, because writing of data in ($WL_0$, $SU_0$)h will not fail due to the second issue, the memory controller 18 can generate the reproduction information Parity 2 (Plane 0+1, $WL_0$, $SU_0$) from the reproduction information Parity 1 (Plane 0, $WL_0$, $SU_0$) and the reproduction information Parity 1 (Plane 1, $WL_0$, $SU_0$), and stores the generated reproduction information Parity 2 in the reproduction information storage unit 318. Then, the memory controller 18 can delete the reproduction information Parity 1 (Plane 0, $WL_0$, $SU_0$) and the reproduction information Parity 1 (Plane 1, $WL_0$, $SU_0$) from the reproduction information storage unit 318.

The capacity of the reproduction information storage unit 318 can be reduced, as compared with the first embodiment, by deleting two pieces of reproduction information Parity 1 and storing one piece of reproduction information Parity 2.

In the same manner, at time T5, the writing of data to ($WL_0$, $SU_1$) in each nonvolatile semiconductor memory 1 is completed. At this time, because writing of the data in ($WL_0$, $SU_1$) will not fail due to the second issue, the memory controller 18 can generate the reproduction information Parity 2 (Plane 0+1, $WL_0$, $SU_1$) from the reproduction information Parity 1 (Plane 0, $WL_0$, $SU_1$) and the reproduction information Parity 1 (Plane 1, $WL_0$, $SU_1$), and stores the generated reproduction information Parity 2 in the reproduction information storage unit 318. Then, the memory controller 18 can delete the reproduction information Parity 1 (Plane 0, $WL_0$, $SU_1$) and the reproduction information Parity 1 (Plane 1, $WL_0$, $SU_1$) from the reproduction information storage unit 318.

In the same manner, during time T6 to time T8, the memory controller 18 can generate the Parity 2 from the Parity 1 that corresponds to a WLSU in which the second issue will not occur, and can delete the unnecessary Parity 1 from the reproduction information storage unit 318.

With the semiconductor memory device according to the second embodiment, which is described above, because two pieces of reproduction information Parity 1 are deleted and one piece of reproduction information Parity 2 is generated, the capacity of the reproduction information storage unit can be reduced and the reliability of the semiconductor memory device can be improved.

Third Embodiment

A semiconductor memory device according to a first embodiment stores the generated reproduction information Parity 1 in a reproduction information storage unit 318 or a buffer 302. In contrast, a semiconductor memory device according to a third embodiment stores the reproduction information Parity 1 within a memory of a host 200.

Figure 22:
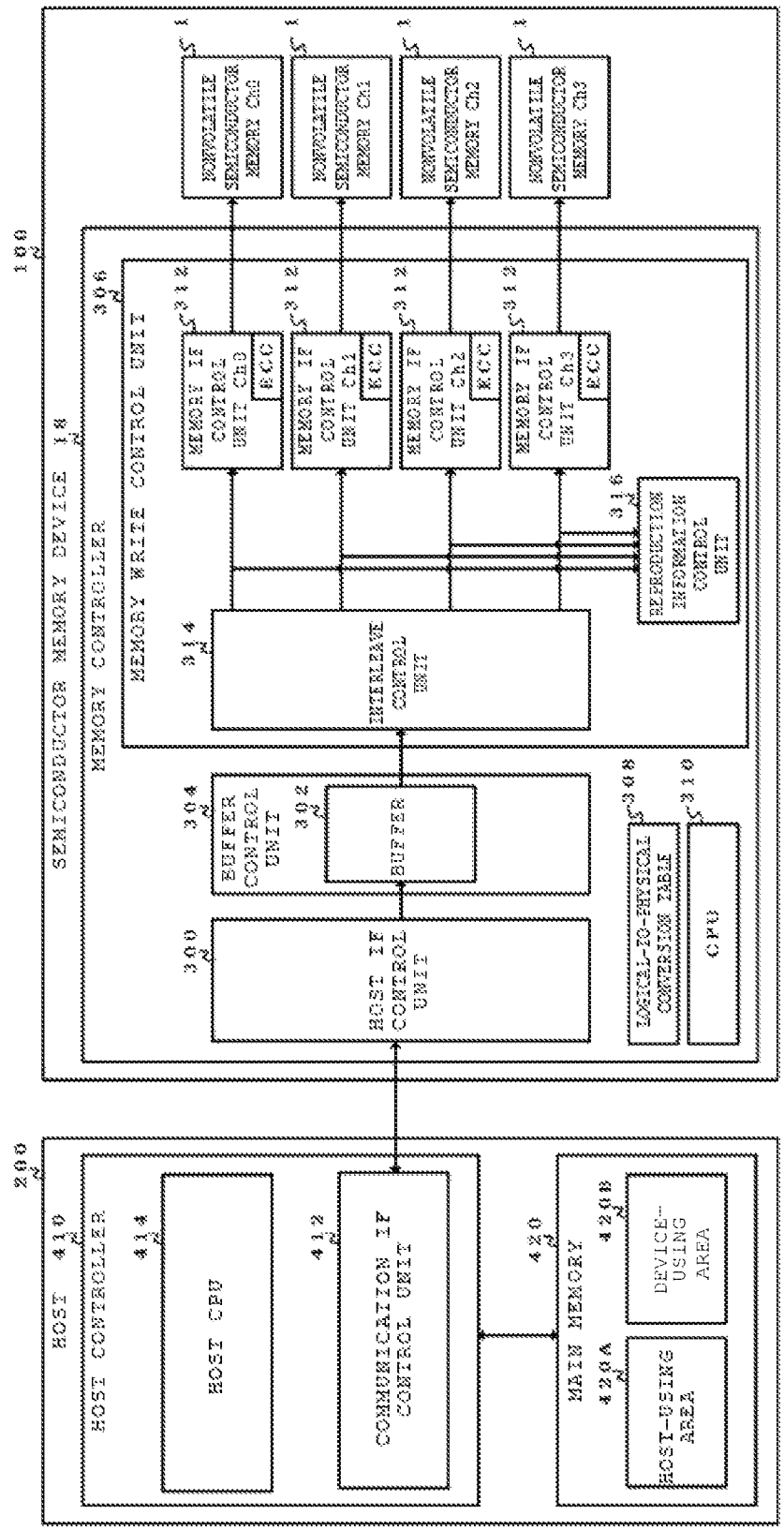
FIG. 22 is a block diagram illustrating a schematic configuration of a memory system incorporating a semiconductor device according to a third embodiment.

FIG. 22 is a block diagram illustrating a schematic configuration of a memory system including the semiconductor device according to the third embodiment. In FIG. 22, the same components as depicted in FIG. 9 are indicated by the same reference numeral used in FIG. 9. Furthermore, the configuration of a semiconductor memory device 100 according to the third embodiment is otherwise the same as depicted in FIGS. 1 to 8 for the first embodiment.

The semiconductor memory device according to the third embodiment can, in general, employ the same configuration as a semiconductor memory device according to the first embodiment. The semiconductor memory device according to the third embodiment does not need to include the reproduction information storage unit 318, but may do so in some examples.

A host 200 according to the third embodiment includes a host controller 410 and a main memory 420. The host controller 410 includes a communication interface (IF) control unit 412 and a CPU (host CPU) 414. The host controller 410 and the main memory 420 are connected to each other through a bus.

The host CPU 414 is a processor that controls components within the host 200. The host CPU 414 executes various programs that are loaded onto the main memory 420 from the semiconductor memory device 100 or other storage devices. These programs can include an operating system, a file system, and various application programs.

The communication IF control unit 412, for example, transmits various commands to the semiconductor memory device 100 under the control of the operating system and the file system. Furthermore, the communication IF control unit 412 performs interpretation, execution, or the like of a command that is received from the semiconductor memory device 100.

The main memory 420, for example, is configured with DRAM. The main memory 420 includes a host-using area 420A and a device-using area 420B. The host-using area 420A is used as a program-loading area when the host 200 executes the operating system or various programs, or is used as a work area when the host 200 executes a program that is loaded onto the program-loading area. The device-using area 420B can be used as a cache area for data that is used by the semiconductor memory device 100. As an example of data that can be cached in the device-using area 420B, there is a logical-to-physical conversion table 308 or write data. Normally, the capacity (data storage size) of the device-using area 420B is larger than a capacity (data storage size) of the buffer 302 that is in the semiconductor memory device 100. It is possible that a memory capacity of the device-using area 420B, for example, can be designated by the host controller 410.

Various operations in which the semiconductor memory device 100 accesses the device-using area 420B, such as reading or writing, can be used. The memory controller 18 can transmit a command (a read, write, or delete command, or the like) for accessing the device-using area 420B to the host 200 via a host IF control unit 300.

A write request to the device-using area 420B may include a device-using area offset address, write data, and a data length, and the like. The device-using area offset address indicates a target offset address that designates a head address of a location within the device-using area 420B that is to be accessed. The host controller 410 may retain a start address of the device-using area 420B within the main memory 420. When a write request to the device-using area 420B is received, the host controller 410 obtains an actual memory address by adding the target offset address to the start address and so forth, and then writes write data designated by the write request to the device-using area 420B, to an area that starts from a location which corresponds to such a memory address.

A read request to the device-using area 420B may include the target offset address, the data length, and the like. When the read request to the device-using area 420B is received, the host controller 410 obtains an actual memory address by adding a device-using area offset address to a base address and so forth, reads data from a location that corresponds to such a memory address, and then transmits the data, which has been read, to the semiconductor memory device 100 via the communication IF control unit 412.

A delete request for the device-using area 420B may include the target offset address, the data length, and the like. When the delete request for the device-using area 420B is received, the host controller 410 obtains an actual memory address by adding a target offset address to a start address, and so forth, deletes data that has a size equivalent to a data length designated by the delete request to the device-using area 420B, which is an area that starts from a location which corresponds to such a memory address, and transmits a result of the deletion to the semiconductor memory device 100 via the communication IF control unit 412.

Furthermore, the device-using area 420B, for example, can be realized by a unified memory (UM) area. In a case where the device-using area 420B is realized as a UM area, the semiconductor memory device 100 can perform reading or writing on the device-using area 420B based on specifications for Universal Flash Storage (UFS) Unified Memory Extension.

In the case where the device-using area 420B is realized as a UM area, the memory controller 18 can access the device-using area 420B by transmitting a UM write request, a UM read request, a UM delete request, and the like, which are commands for accessing the device-using area 420B, to the host 200 via the host IF control unit 300.

The UM write request may include a target UM area offset, write data, a data length, and the like. The target UM area offset indicates the target offset address that indicates the head address within the device-using area 420B that has to be accessed. The host controller 410 may retain a UM base address that is a start address of the device-using area 420B within the main memory 420. When the UM write request is received, the host controller 410 obtains an actual memory address by adding the target offset address to the UM base address and so forth, and writes write data of the UM write request to an area that starts from a location which corresponds to such a memory address.

The UM read request may include a target UM area offset, a data length, and the like. When the UM read request is received, the host controller 410 obtains an actual memory address by adding a target offset address to the UM base address and so forth, then reads data from a location that corresponds to such a memory address, and transmits the data, which has been read, to the semiconductor memory device 100 via the communication IF control unit 412.

The UM delete request may include the target UM area offset, the data length, and the like. When the UM delete request is received, the host controller 410 obtains an actual memory address by adding the target offset address to the UM base address and so forth, then deletes data that has a size that is equivalent to a data length designated by the UM delete request and then transmits a result of the deletion to the semiconductor memory device 100 via the communication IF control unit 412.

Next, writing of data to the nonvolatile semiconductor memory 1, generation of the reproduction information Parity 1, and timing for retention of the reproduction information Parity 1 are described.

In the same manner as in the semiconductor memory device according to the first embodiment, in the semiconductor memory device according to the third embodiment, the memory controller 18 first writes data for WLSU that is ($WL_0$, $SU_0$) within each block, and next writes data for WLSU that is ($WL_0$, $SU_1$). Subsequently, the memory controller 18 writes pieces of data for ($WL_0$, $SU_2$), ($WL_0$, $SU_3$), ($WL_1$, $SU_0$), ($WL_1$, $SU_1$), and so forth in this order.

Figure 23:
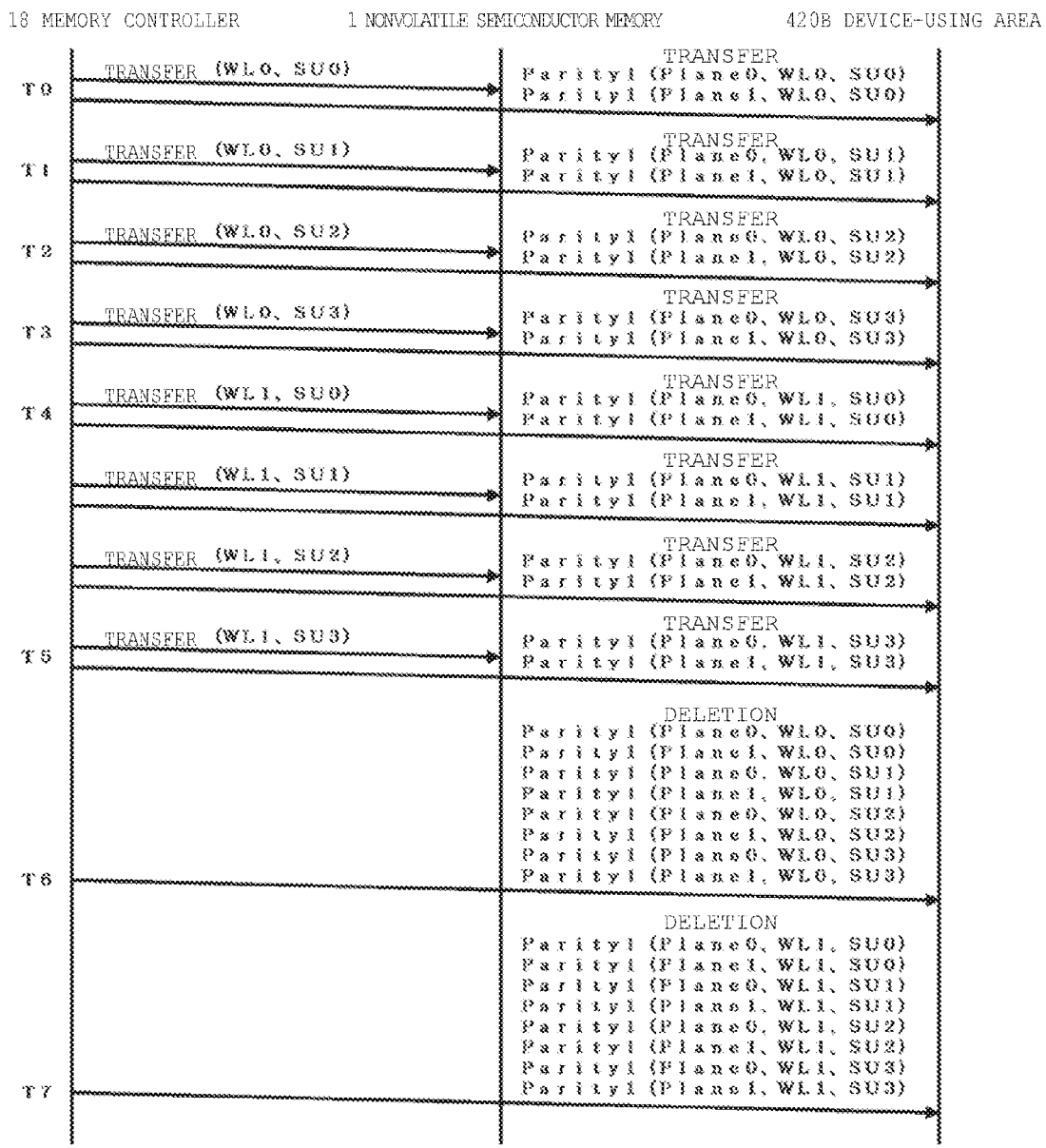
FIG. 23 is a sequence diagram illustrating an example in which write data is transferred to a nonvolatile memory and reproduction information is transferred to a device-using area.

FIG. 23 is a sequence diagram illustrating an example in which the write data is transferred to the nonvolatile semiconductor memory 1 and the reproduction information Parity 1 is transferred to the device-using area 420B at the same timing as in FIG. 18. That is, FIG. 23 illustrates a processing sequence for the transfer of the write data to the nonvolatile semiconductor memory 1 and the transfer of the reproduction information Parity 1 to the device-using area 420B in a case where the pieces of data that are to be written to ($WL_0$, $SU_0$) to ($WL_0$, $SU_3$) are transferred from the memory controller 18 to each nonvolatile semiconductor memory 1 at points in time T0 to T3, and where the pieces of data that are to be written to ($WL_1$, $SU_0$) to ($WL_1$, $SU_3$) are transferred from the memory controller 18 to each nonvolatile semiconductor memory 1 from time T4 to T5.

Processing that writes data to the nonvolatile semiconductor memory 1 using the memory controller 18 in the semiconductor memory device according to the third embodiment is the same as that which writes data to the nonvolatile semiconductor memory 1 using the memory controller 18 in the semiconductor memory device according to the first embodiment.

Generation of the reproduction information Parity 1 by a reproduction information control unit 316 in the semiconductor memory device according to the present embodiment is the same as the generation of the reproduction information Parity 1 by the reproduction information control unit 316 in the semiconductor memory device according to the first embodiment.

Timing for the generation of the reproduction information Parity 1 by the reproduction information control unit 316 in the semiconductor memory device according to the third embodiment is the same as in the semiconductor memory device according to the first embodiment.

At time T0, the memory controller 18 transfers data that is to be written to ($WL_0$, $SU_0$), that is, WLSU #1, to each nonvolatile semiconductor memory 1. At this time, the memory controller 18 generates reproduction information Parity 1 (Plane 0, $WL_0$, $SU_0$) and reproduction information Parity 1 (Plane 1, $WL_0$, $SU_0$), and then transfers the generated reproduction information Parity 1 to the device-using area 420B through the host controller 410 for storage.

At time T1, the memory controller 18 transfers data that is to be written to ($WL_0$, $SU_1$), that is, WLSU #2, to each nonvolatile semiconductor memory 1. At this time, the memory controller 18 generates reproduction information Parity 1 (Plane 0, $WL_0$, $SU_1$) and reproduction information Parity 1 (Plane 1, $WL_0$, $SU_1$), and then transfers the generated reproduction information Parity 1 to the device-using area 420B through the host controller 410 for storage.

At time T2, the memory controller 18 transfers data that is to be written to ($WL_0$, $SU_2$), that is, WLSU #3, to each nonvolatile semiconductor memory 1. At this time, the memory controller 18 generates reproduction information Parity 1 (Plane 0, $WL_0$, $SU_2$) and reproduction information Parity 1 (Plane 1, $WL_0$, $SU_2$), and then transfers the generated reproduction information Parity 1 to the device-using area 420B through the host controller 410 for storage.

At time T3, the memory controller 18 transfers data that is to be written to ($WL_0$, $SU_3$), that is, WLSU #4, to each nonvolatile semiconductor memory 1. At this time, the memory controller 18 generates reproduction information Parity 1 (Plane 0, $WL_0$, $SU_3$) and reproduction information Parity 1 (Plane 1, $WL_0$, $SU_3$), and then transfers the generated reproduction information Parity 1 to the device-using area 420B through the host controller 410 for storage.

In the same manner, at times 14 and T5, data pieces that are to be written to ($WL_1$, $SU_0$) to ($WL_1$, $SU_3$) are transferred from the memory controller 18 to each nonvolatile semiconductor memory 1. At this time, the memory controller 18 generates reproduction information Parity 1 (Plane 0, $WL_1$, $SU_0$) to reproduction information Parity 1 (Plane 0, $WL_1$, $SU_3$), and reproduction information Parity 1 (Plane 1, $WL_1$, $SU_0$) to reproduction information Parity 1 (Plane 1, $WL_1$, $SU_3$), and transfers the generated reproduction information Parity 1 to the device-using area 420B through the host controller 410 for storage.

From time T0 to T5, when the generated reproduction information Parity 1 is transferred to the device-using area 420B for storage, the reproduction information Parity 1 can be stored in a predetermined area of the device-using area 420B by transmitting a write request to the host 200. Furthermore, in a case where the device-using area 420B is realized by a UM area, the memory controller 18 can store the reproduction information Parity 1 in a predetermined area of the device-using area 420B by transmitting a UM write request to the host 200.

At time T6, the writing of data to $WL_1$ within each nonvolatile semiconductor memory 1 is completed. Then, regarding data for $WL_0$, because there is no likelihood that data will be lost due to a first issue or a second issue (as such are described above), the memory controller 18 can delete reproduction information Parity 1 (Plane 0, $WL_0$, $SU_0$) to reproduction information Parity 1 (Plane 0, $WL_0$, $SU_3$), and reproduction information Parity 1 (Plane 1, $WL_0$, $SU_0$) to reproduction information Parity 1 (Plane 1, $WL_0$, $SU_3$), from the device-using area 420B.

In the same manner, at time T7, the writing of data for $WL_2$ within each nonvolatile semiconductor memory 1 is completed. Then, regarding data for $WL_1$, because there is no possibility that data will be lost as a result of the first issue and the second issue, the memory controller 18 can delete reproduction information Parity 1 (Plane 0, $WL_1$, $SU_0$) to reproduction information Parity 1 (Plane 0, $WL_1$, $SU_3$), and reproduction information Parity 1 (Plane 1, $WL_1$, $SU_0$) to reproduction information Parity 1 (Plane 1, $WL_1$, $SU_3$), from the device-using area 420B.

When the generated reproduction information Parity 1 is deleted from the device-using area 420B, the memory controller 18 can delete the reproduction information Parity 1 from a predetermined area of the device-using area 420B by transmitting the delete request to the device-using area 420B to the host 200. Furthermore, in a case where the device-using area 420B is realized by a UM area, the memory controller 18 can delete the reproduction information Parity 1 from a predetermined area of the device-using area 420B by transmitting the UM delete request to the host 200.

Furthermore, the timing at which the memory controller 18 deletes reproduction information Parity 1 (Plane 0, $WL_0$, $SU_0$) to reproduction information Parity 1 (Plane 0, $WL_0$, $SU_3$) and reproduction information Parity 1 (Plane 1, $WL_0$, $SU_0$) to reproduction information Parity 1 (Plane 1, $WL_0$, $SU_3$) from the device-using area 420B may be at time T6 or may be at an arbitrary time after time T6.

In the same manner, the timing at which the memory controller 18 deletes reproduction information Parity 1 (Plane 0, $WL_1$, $SU_0$) to reproduction information Parity 1 (Plane 0, $WL_1$, $SU_3$) and reproduction information Parity 1 (Plane 1, $WL_1$, $SU_0$) to reproduction information Parity 1 (Plane 1, $WL_1$, $SU_3$) from the device-using area 420B may be at time T7 or may be at an arbitrary time after time T7.

Next, a method of reproducing data that uses reproduction information is described taking as an example a case where, in the same manner as in FIG. 13, it is assumed that after pieces of data have been written to memory cells WLSU #1 to WLSU #5, when data is being written to a memory cell WLSU #6, $WL_0$ and $WL_1$ in Plane 0, Block A in nonvolatile semiconductor memory CH0 are short-circuited. In this case, the first issue occurs in [Ch0, Plane 0, Block A, WLSU #1] to [Ch0, Plane 0, Block A, WLSU #6].

First, reproduction of data for [Ch0, Plane 0, Block A, WLSU #1] that has the likelihood of being lost due to the first issue is described.

When the writing of data to [Ch0, Plane 0, Block A, WLSU #6] fails, the memory controller 18 reads data from [Ch0, Plane 0, Block A, WLSU #1] that is connected to an adjacent word line ($WL_0$). As a result of reading the data, the memory controller 18 recognizes that data for [Ch0, Plane 0, Block A, WLSU #1] cannot be correctly read, that is, that the data is lost.

At this time, the memory controller 18 reads data from [Ch1, Plane 0, Block C, WLSU #1], [Ch2, Plane 0, Block E, WLSU #1], and [Ch3, Plane 0, Block G, WLSU #1]. Additionally, the memory controller 18 reads reproduction information Parity 1 (Plane 0, WLSU #1) from the device-using area 420B. Each piece of data and each piece of reproduction information that are read are stored, for example, in the buffer 302. Then, the memory controller 18 can reproduce data for [Ch0, Plane 0, Block A, WLSU #1] by performing an XOR operation on these pieces of data reproduction information.

The reproduced data is written to WLSU (for example, [Ch0, Plane 0, Block A, WLSU #9]) other than [Ch0, Plane 0, Block A, WLSU #1]. Information on WLSU to which the data is written is recorded in the logical-to-physical conversion table 308.

In the same manner, the memory controller 18 can reproduce pieces of data for [Ch0, Plane 0, Block A, WLSU #2] to [Ch0, Plane 0, Block A, WLSU #6].

Next, reproduction of data for [Ch0, Plane 1, Block B, WLSU #6] in which there is a likelihood that the writing of data will fail due to the second issue is described.

When the writing of data to [Ch0, Plane 0, Block A, WLSU #6] fails, the memory controller 18 reads data from [Ch0, Plane 1, Block B, WLSU #6] in another plane that shares a driver 13. As a result of reading the data, the memory controller 18 recognizes that data for [Ch0, Plane 1, Block B, WLSU #6] cannot be correctly read, that is, that the writing of data fails.

At this time, the memory controller 18 reads data from [Ch1, Plane 1, Block D, WLSU #6], [Ch2, Plane 1, Block F, WLSU #6], and [Ch3, Plane 1, Block H, WLSU #6]. Additionally, the memory controller 18 reads reproduction information Parity 1 (Plane 1, WLSU #6) from the device-using area 420B. Each piece of data that is read and each piece of reproduction information that is read are stored, for example, in the buffer 302. Then, the memory controller 18 can reproduce data for [Ch0, Plane 1, Block B, WLSU #6] by performing the XOR operation on this piece of data and this piece of data reproduction information.

The reproduced data is written to WLSU (for example, [Ch0, Plane 1, Block B, WLSU #10]) other than [Ch0, Plane 1, Block B, WLSU #6]. Information on WLSU to which the data is written is recorded in the logical-to-physical conversion table 308.

When the generated reproduction information Parity 1 is read from the device-using area 420B, the memory controller 18 can read the reproduction information Parity 1 from a predetermined area of the device-using area 420B by transmitting the read request to the device-using area 420B to the host 200. Furthermore, in the case where the device-using area 420B is realized by a UM area, the memory controller 18 can read the reproduction information Parity 1 from a predetermined area of the device-using area 420B by transmitting the UM read request to the host 200.

In the same manner as in the generation processing of the reproduction information Parity 1 in the semiconductor memory device according to the first embodiment, in the semiconductor memory device according to the present embodiment, the reproduction information may not be generated based on the data that is written to each WLSU of the nonvolatile semiconductor memory 1 in one other channel. That is, although data is written to a WLSU in the same channel in the nonvolatile semiconductor memory 1, no problem arises from this if such WLSU is a WLSU that belongs to a word line that is not influenced by the first and second issues. Furthermore, in the same manner as in the generation processing of the reproduction information Parity 1 in the semiconductor memory device according to the first embodiment, a type of arithmetic operation for generating the reproduction information is not limited to the exclusive OR (XOR) operation. Additionally, the reproduction information may be data that is written to each nonvolatile semiconductor memory 1.

In a sequence diagram that is illustrated in FIG. 23, the memory controller 18 stores the reproduction information Parity 1 in the device-using area 420B within the host 200, but may store one portion of the reproduction information Parity 1 in a built-in memory of the memory controller 18 or the buffer 302 and may store the other portions of the reproduction information Parity 1 in the device-using area 420B within the host 200. Furthermore, the memory controller stores the reproduction information Parity 1 in the device-using area 420B within the host 200, but may store one portion of the reproduction information Parity 1 in the built-in memory of the memory controller 18 or the buffer 302. The memory controller 18 can arbitrarily determine which portion of the reproduction information Parity 1 is stored in the built-in memory of the memory controller 18 or the buffer 302. For example, the memory controller 18 may store the reproduction information Parity 1 for a predetermined SU among $SU_0$ to $SU_3$ in the built-in memory of the memory controller 18 or the buffer 302.

Figure 24:
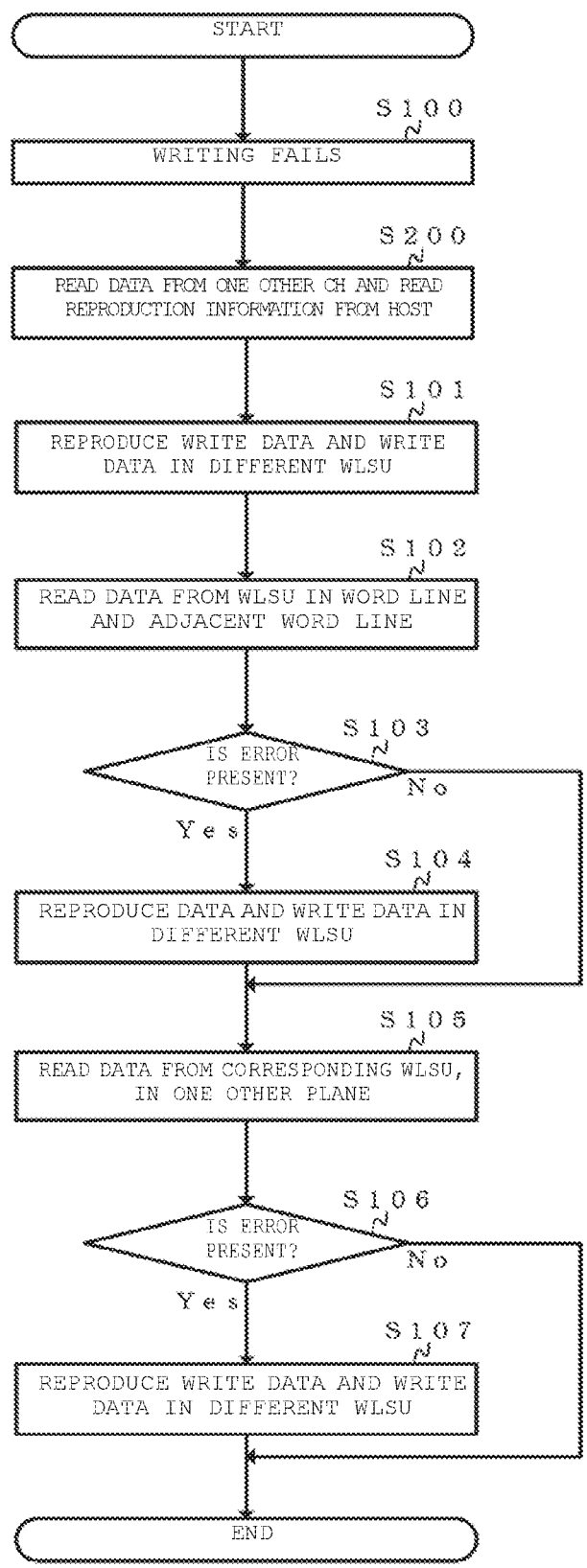
FIG. 24 depicts a procedure in which a memory controller reproduces data when data writing to a nonvolatile memory fails in a device according to a third embodiment.

Next, a procedure for reproducing data when the writing of data fails is described. FIG. 24 is a flowchart for the procedure in which the memory controller 18 reproduces data in a case where the writing of data to the nonvolatile semiconductor memory 1 in the semiconductor memory device according to the present embodiment fails. In FIG. 24, the same constituent as in the configuration in FIG. 17 is indicated by the same reference numeral.

When the writing of data to a memory cell that is WLSU fails (S100), the memory controller 18 reads data from the nonvolatile semiconductor memory 1 in one other channel, and reads the reproduction information Parity 1 from the device-using area 420B through the host controller 410 (S200).

Next, the memory controller 18 reproduces data of which the writing fails, using the data and the reproduction information that are read, and writes the reproduced data to WLSU different from WLSU to which the writing fails (S101).

Next, the memory controller 18 reads pieces of data from different WLSU that belongs to a word line to which the memory cell, the writing of data to which fails, is connected, and from WLSU that belongs to a word line which is adjacent to such a word line (S102). In a case where an error is present in the data that is read (YES in S103), that is, in a case where the data is lost due to the first issue, the memory controller 18 reproduces data for WLSU in question and writes the reproduced data to different WLSU (S104).

Next, the memory controller 18 reads data from WLSU in one other plane that corresponds to WLSU to which the memory cell, the writing of data to which fails, belongs (S105). In a case where an error is present in the data that is read (YES in S106), that is, in a case where the writing of data fails due to the second issue, the memory controller 18 reproduces data for WLSU in question and writes the reproduced data to different WLSU (S107).

It is noted that each of the steps S102, S103, S105, and S106 may be omitted. That is, regardless of the occurrence and non-occurrence of the loss of data and the occurrence and non-occurrence of the failure of the writing of data, the memory controller 18 may reproduce that data. Furthermore, if it is determined that a memory cell, WLSU in which the loss of data or the failure of the writing of data occurs is not physically destroyed, the memory controller 18 may write the reproduced data to same WLSU, in each of Steps S101 and S104, and S107.

With the semiconductor memory device according to the third embodiment described above, as is the case with the semiconductor memory device according to the first embodiment, in a case where the loss of data or the failure of the writing of data occurs, because the data can be reproduced, reliability of the semiconductor memory device can be improved.

Furthermore, with the semiconductor memory device according to the third embodiment, an amount of data that is stored in the semiconductor memory device can be reduced by causing the reproduction information Parity 1 to be stored in the memory of the host other than the semiconductor memory device.

Fourth Embodiment

A semiconductor memory device according to the second embodiment, described above, stores the generated reproduction information Parity 2 in the reproduction information storage unit 318 or the buffer 302. In contrast, a semiconductor memory device according to a fourth embodiment stores the reproduction information Parity 2 within a memory within a host 200.

In a description of the fourth embodiment, the aspects that are the same in configuration and operation as the third embodiment are repeated.

The semiconductor memory device according to the fourth embodiment can employ the same configuration as the semiconductor memory device according to the third embodiment. Furthermore, a memory system in which the semiconductor device according to the fourth embodiment can be used corresponds substantially to the memory system in which the semiconductor device according to the third embodiment can be used.

Next, writing of data to the nonvolatile semiconductor memory 1, generation of the reproduction information Parity 2, and timing for retention of the reproduction information Parity 2 are described.

In the same manner as in the semiconductor memory device according to the second embodiment, the memory controller 18 in the fourth embodiment first writes data for a WLSU that is ($WL_0$, $SU_0$) within each block, and next writes data for a WLSU that is ($WL_0$, $SU_1$). Subsequently, the memory controller 18 writes pieces of data for ($WL_0$, $SU_2$), ($WL_0$, $SU_3$), ($WL_1$, $SU_0$). ($WL_1$, $SU_1$), and so forth, in this order.

Figure 21:
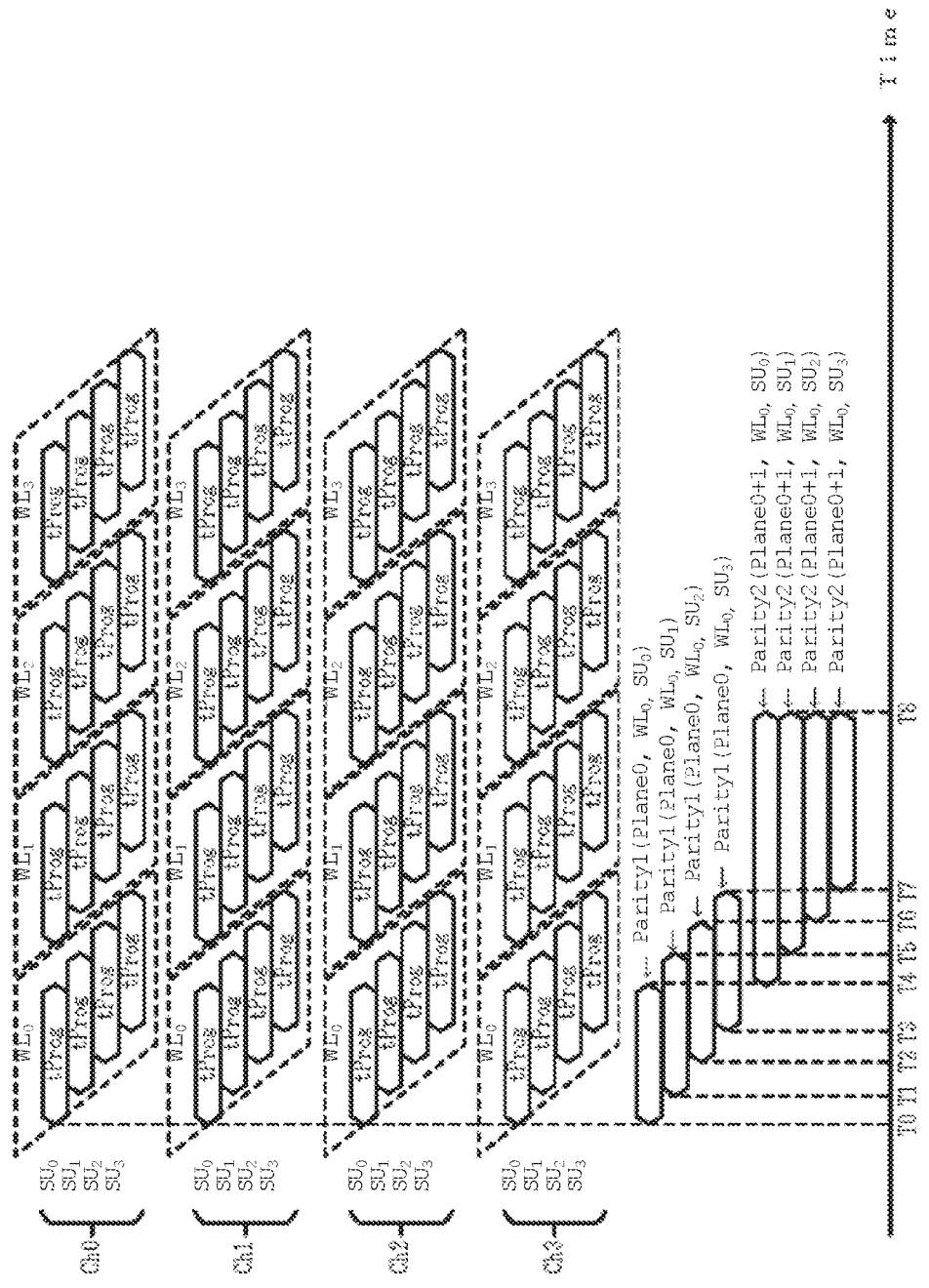
FIG. 21 is a timing chart illustrating generation and retention of reproduction information according to the second embodiment.
Figure 25:
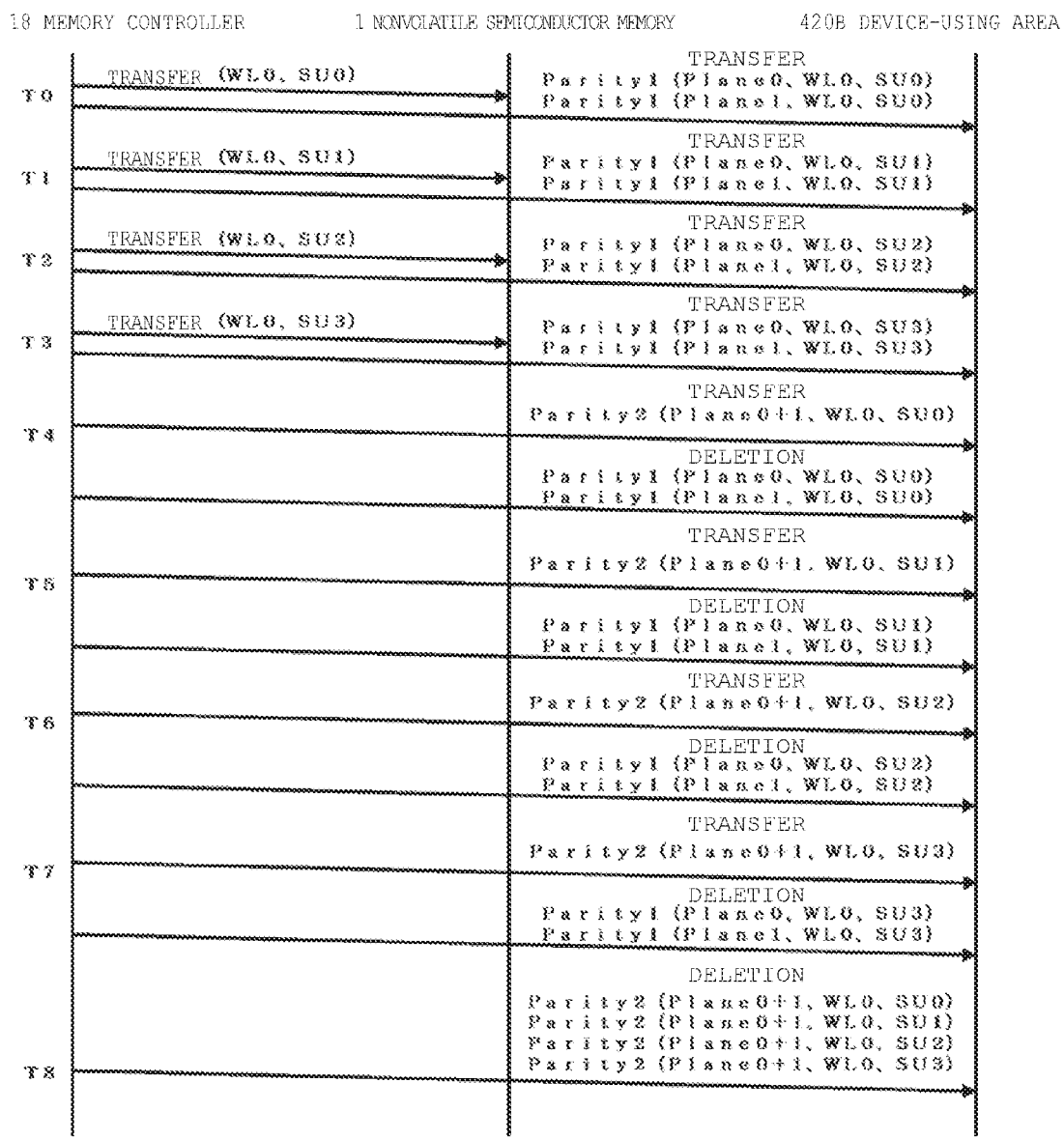
FIG. 25 is a sequence diagram illustrating an example in which certain write data is transferred within a memory block and parity information is transferred to a device-using area.

FIG. 25 is a sequence diagram illustrating an example in which the write data is transferred to data for a WLSU that is ($WL_0$, $SU_0$), data for a WLSU that is ($WL_0$, $SU_1$), data for a WLSU that is ($WL_0$, $SU_2$), and data for a WLSU that is ($WL_0$, $SU_3$) within a block of the nonvolatile semiconductor memory 1 at the same timing as in FIG. 21, and in which the reproduction information Parity 1 and the reproduction information Parity 2 are transferred to the device-using area 420B. That is, FIG. 25 illustrates a processing sequence in which the write data is transferred to the nonvolatile semiconductor memory 1, the reproduction information Parity 1 is transferred and the reproduction information Parity 2 is transferred, in a case where reproduction information Parity 1 (Plane 0, $WL_0$, $SU_0$) to reproduction information Parity 1 (Plane 0, $WL_0$, $SU_3$) are generated and transferred at time T0 to T3, and where reproduction information Parity 2 (Plane 0+1, $WL_0$, $SU_0$) to reproduction information Parity 2 (Plane 0+1, $WL_0$, $SU_3$) are generated and transferred at time T4 to T7.

The processing by which the memory controller 18 writes data to the nonvolatile semiconductor memory 1 in the semiconductor memory device according to the fourth embodiment is the same as that by which the memory controller 18 writes data to the nonvolatile semiconductor memory 1 in the semiconductor memory device according to the second embodiment.

Generation of the reproduction information Parity 1 by reproduction information control unit 316 in the semiconductor memory device according to the fourth embodiment is the same as the generation of the reproduction information Parity 1 by reproduction information control unit 316 in the semiconductor memory device according to the second embodiment.

The timing for generation of the reproduction information Parity 1 in the semiconductor memory device according to the fourth embodiment is the same as the timing for generation of the reproduction information Parity 1 in the semiconductor memory device according to the second embodiment.

Generation of the reproduction information Parity 2 by a reproduction information control unit 316 in the semiconductor memory device according to the fourth embodiment is the same as the generation of the reproduction information Parity 2 by the reproduction information control unit 316 in the semiconductor memory device according to the second embodiment.

The timing for the generation of the reproduction information Parity 2 in the semiconductor memory device according to the fourth embodiment is the same as the timing for the generation of the reproduction information Parity 2 in the semiconductor memory device according to the second embodiment.

At time T0, the memory controller 18 transfers data that is to be written to ($WL_0$, $SU_0$), that is, WLSU #1, to each nonvolatile semiconductor memory 1. At this time, the memory controller 18 generates reproduction information Parity 1 (Plane 0, $WL_0$, $SU_0$) and reproduction information Parity 1 (Plane 1, $WL_0$, $SU_0$), and transfers this generated reproduction information Parity 1 to the device-using area 420B through the host controller 410 for storage.

At time T1, the memory controller 18 transfers data that is to be written to ($WL_0$, $SU_1$), that is, WLSU #2, to each nonvolatile semiconductor memory 1. At this time, the memory controller 18 generates reproduction information Parity 1 (Plane 0, $WL_0$, $SU_1$) and reproduction information Parity 1 (Plane 1, $WL_0$, $SU_1$), and transfers this generated reproduction information Parity 1 to the device-using area 420B through the host controller 410 for storage.

At time T2, the memory controller 18 transfers data that is to be written to ($WL_0$, $SU_2$), that is, WLSU #3, to each nonvolatile semiconductor memory 1. At this time, the memory controller 18 generates reproduction information Parity 1 (Plane 0, $WL_0$, $SU_2$) and reproduction information Parity 1 (Plane 1, $WL_0$, $SU_2$), and transfers this generated reproduction information Parity 1 to the device-using area 420B through the host controller 410 for storage.

At time T3, the memory controller 18 transfers data that is to be written to ($WL_0$, $SU_3$), that is, WLSU #4, to each nonvolatile semiconductor memory 1. At this time, the memory controller 18 generates reproduction information Parity 1 (Plane 0, $WL_0$, $SU_3$) and reproduction information Parity 1 (Plane 1, $WL_0$, $SU_3$), and transfers this generated reproduction information Parity 1 to the device-using area 420B through the host controller 410 for storage.

At time T4, the writing of data to ($WL_0$, $SU_0$) within each nonvolatile semiconductor memory 1 is completed. Then, regarding data for ($WL_0$, $SU_0$), because there is no likelihood that the writing of data will fail due to the second issue, the memory controller 18 generates reproduction information Parity 2 (Plane 0+1, $WL_0$, $SU_0$) from the reproduction information Parity 1 (Plane 0, $WL_0$, $SU_0$) and the reproduction information Parity 1 (Plane 1, $WL_0$, $SU_0$), and then transfers this generated reproduction information Parity 2 to the device-using area 420B for storage. Then, the memory controller 18 can now delete reproduction information Parity 1 (Plane 0, $WL_0$, $SU_0$) and reproduction information Parity 1 (Plane 1, $WL_0$, $SU_0$) from the device-using area 420B.

At time T5, the writing of data to ($WL_0$, $SU_1$) within each nonvolatile semiconductor memory 1 is completed. Then, regarding data for ($WL_0$, $SU_1$), because there is no likelihood that the writing of data will fail due to the second issue, the memory controller 18 generates reproduction information Parity 2 (Plane 0+1, $WL_0$, $SU_1$) from the reproduction information Parity 1 (Plane 0, $WL_0$, $SU_1$) and the reproduction information Parity 1 (Plane 1, $WL_0$, $SU_1$), and then transfers the generated reproduction information Parity 2 to the device-using area 420B for storage. Then, the memory controller 18 can delete reproduction information Parity 1 (Plane 0, $WL_0$, $SU_1$) and reproduction information Parity 1 (Plane 1, $WL_0$, $SU_1$) from the device-using area 420B.

At time T6, the writing of data to ($WL_0$, $SU_2$) within each nonvolatile semiconductor memory 1 is completed. Then, regarding data for ($WL_0$, $SU_2$), because there is no likelihood that the writing of data will fail due to the second issue, the memory controller 18 generates reproduction information Parity 2 (Plane 0+1, $WL_0$, $SU_2$) from the reproduction information Parity 1 (Plane 0, $WL_0$, $SU_2$) and the reproduction information Parity 1 (Plane 1, $WL_0$, $SU_2$), and transfers this generated reproduction information Parity 2 to the device-using area 420B for storage. Then, the memory controller 18 can delete reproduction information Parity 1 (Plane 0, $WL_0$, $SU_2$) and reproduction information Parity 1 (Plane 1, $WL_0$, $SU_2$) from the device-using area 420B.

At time T7, the writing of data to ($WL_0$, $SU_3$) within each nonvolatile semiconductor memory 1 is completed. Then, regarding data for ($WL_0$, $SU_3$), because there is no likelihood that the writing of data will fail due to the second issue, the memory controller 18 generates reproduction information Parity 2 (Plane 0+1, $WL_0$, $SU_3$) from the reproduction information Parity 1 (Plane 0, $WL_0$, $SU_3$) and the reproduction information Parity 1 (Plane 1, $WL_0$, $SU_3$), and then transfers the generated reproduction information Parity 2 to the device-using area 420B for storage. Then, the memory controller 18 can delete reproduction information Parity 1 (Plane 0, $WL_0$, $SU_3$) and reproduction information Parity 1 (Plane 1, $WL_0$, $SU_3$) from the device-using area 420B.

At time T8, the writing of data to $WL_1$ within each nonvolatile semiconductor memory 1 is completed. Then, regarding data for $WL_0$, because there is no likelihood that the data will be lost due to the first issue, the memory controller 18 can delete reproduction information Parity 2 (Plane 0+1, $WL_0$, $SU_0$) to reproduction information Parity 2 (Plane 0+1, $WL_0$, $SU_3$) from the device-using area 420B.

The timing at which the memory controller 18 deletes reproduction information Parity 1 (Plane 0, $WL_0$, $SU_0$) and reproduction information Parity 1 (Plane 1, $WL_0$, $SU_0$) from the device-using area 420B may be at time 14, or may be an arbitrary time after time T4.

In the same manner, timing at which the memory controller 18 deletes reproduction information Parity 1 (Plane 0, $WL_0$, $SU_1$) and reproduction information Parity 1 (Plane 1, $WL_0$, $SU_1$) from the device-using area 420B may be at time T5 or may be an arbitrary time after time T5.

In the same manner, the timing at which the memory controller 18 deletes reproduction information Parity 1 (Plane 0, $WL_0$, $SU_2$) and reproduction information Parity 1 (Plane 1, $WL_0$, $SU_2$) from the device-using area 420B may be time T6, or may be an arbitrary time after time T6.

In the same manner, the timing at which the memory controller 18 deletes reproduction information Parity 1 (Plane 0, $WL_0$, $SU_3$) and reproduction information Parity 1 (Plane 1, $WL_0$, $SU_3$) from the device-using area 420B may be time T7 or may be an arbitrary time after time T7.

The timing at which the memory controller 18 deletes reproduction information Parity 2 (Plane 0+1, $WL_1$, $SU_0$) to reproduction information Parity 2 (Plane 0+1, $WL_1$, $SU_3$) from the device-using area 420B may be time T8, or may be an arbitrary time after time T8.

In a sequence diagram that is illustrated in FIG. 25, the memory controller 18 stores the reproduction information Parity 1 and the reproduction information Parity 2 in the device-using area 420B within the host 200, but alternatively may store the reproduction information Parity 1 in the built-in memory of the memory controller 18 or the buffer 302 rather than the device-using area 420B within the host 200, and may store just the reproduction information Parity 2 in the device-using area 420B within the host 200. Because latency when data is read from the device-using area 420B within the host 200 is typically higher than latency when data is read from the built-in memory of the memory controller 18 or the buffer 302, the time required for reproducing data using reproduction information Parity 1 can be shortened in this case in comparison with a case where the reproduction information Parity 1 is stored in the device-using area 420B.

Furthermore, in the sequence diagram illustrated in FIG. 25, the memory controller 18 stores the reproduction information Parity 2 in the device-using area 420B, but it may also store just a portion of the reproduction information Parity 2 in the built-in memory of the memory controller 18 or the buffer 302 and may store other portions of the reproduction information Parity 2 in the device-using area 420B. Furthermore, the memory controller 18 can store the reproduction information Parity 2 in the device-using area 420B, but also may store some portion of the reproduction information Parity 2 in the built-in memory of the memory controller 18 or the buffer 302. The memory controller 18 can arbitrarily determine which portion of the reproduction information Parity 2 is to be stored in the built-in memory of the memory controller 18 or the buffer 302. For example, the memory controller 18 may store the reproduction information Parity 2 for a predetermined sting unit SU from among $SU_0$ to $SU_3$ in the built-in memory of the memory controller 18 or the buffer 302.

With the semiconductor memory device according to the fourth embodiment described above, a required size of the reproduction information that must be stored in the memory of the host can be reduced and the reliability of the semiconductor memory device can be improved in comparison with the semiconductor memory device according to the third embodiment by deleting two pieces of reproduction information Parity 1 and causing just one piece of reproduction information Parity 2 to be stored.

With the semiconductor memory device according to the above example embodiments, when a short circuit occurs between two adjacent word lines and the loss of data or the failure of the writing of data occurs, the reliability of the semiconductor memory device can be improved because the data would otherwise be lost or left unwritten can be reproduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of operating a storage device having a plurality of nonvolatile memories, each of which includes first memory cells connected to a first word line and second memory cells connected to a second word line that is adjacent to the first word line, the method comprising:
maintaining parity data for data written in the first memory cells; and
performing a writing operation on the second memory cells in a targeted nonvolatile memory of the plurality of nonvolatile memories, and restoring data written in the first memory cells of the targeted nonvolatile memory using the parity data upon detecting a failure of the writing operation.

2. The method according to claim 1, wherein the restoration uses data written in the first memory cells of nonvolatile memories in the plurality of nonvolatile memories other than the target nonvolatile memory.

3. The method according to claim 1, further comprising:
writing data restored through the restoration to memory cells connected to a third word line different from the first and second word lines.

4. The method according to claim 1, further comprising:
generating the parity data by performing an exclusive OR operation on the data written in the first memory cells.

5. The method according to claim 1, further comprising:
maintaining the parity data in a volatile memory of the storage device.

6. A method of operating a storage device having a plurality of nonvolatile memories, each of which includes first memory cells connected to a first word line and second memory cells connected to a second word line that is adjacent to the first word line, the method comprising:
maintaining parity data for data written to first memory cells of a first memory cell array in a targeted nonvolatile memory of the plurality of nonvolatile memories; and
performing a writing operation on second memory cells of the first memory cell array, and restoring data written in the first memory cells of the first memory array using the parity data upon detecting a failure in the writing operation on the second memory cells.

7. The method according to claim 6, wherein the restoration uses data written in first memory cells of a second memory cell array in the plurality of nonvolatile memories.

8. The method according to claim 6, further comprising:
writing data restored through the restoration to memory cells connected to a third word line different from the first and second word lines.

9. The method according to claim 6, further comprising:
generating the parity data by performing an exclusive OR operation on the data written in the first memory cells.

10. The method according to claim 6, further comprising:
maintaining the parity data in a volatile memory of the storage device.

11. The method according to claim 6, wherein the parity data is maintained in a volatile memory of the storage device.

12. The method according to claim 6, further comprising:
generating second parity data for data written in the second memory cells.

13. The method according to claim 6, wherein each nonvolatile memory of the plurality of nonvolatile memories comprises at least two memory cell arrays.

14. The method according to claim 13, wherein the parity data is maintained in a volatile memory of the storage device.

15. The method according to claim 13, wherein the parity data is maintained in a different memory cell array in the nonvolatile memory.

* * * * *